United States Patent
Wohl et al.

(10) Patent No.: US 9,157,961 B2
(45) Date of Patent: Oct. 13, 2015

(54) TWO-LEVEL COMPRESSION THROUGH SELECTIVE RESEEDING

(71) Applicant: Synopsys, Inc., Mountain View, CA (US)

(72) Inventors: Peter Wohl, Williston, VT (US); John A. Waicukauski, Tualatin, OR (US); Frederic J. Neuveux, Meylan (FR); Gregory A. Maston, Denver, CO (US)

(73) Assignee: Synopsys, Inc, Mountain View, CA (US)

( * ) Notice: Subject to any disclaimer, the term of this patent is extended or adjusted under 35 U.S.C. 154(b) by 221 days.

(21) Appl. No.: 13/831,617

(22) Filed: Mar. 15, 2013

(65) Prior Publication Data

US 2014/0281774 A1 Sep. 18, 2014

(51) Int. Cl.
*G01R 31/28* (2006.01)
*G01R 31/3185* (2006.01)

(52) U.S. Cl.
CPC ............................ *G01R 31/318547* (2013.01)

(58) Field of Classification Search
CPC ............... G01R 31/318547; G01R 31/318536; G01R 31/318575; G01R 31/318555; G01R 31/31721
USPC ....................................................... 714/729
See application file for complete search history.

(56) References Cited

U.S. PATENT DOCUMENTS

| | | | | |
|---|---|---|---|---|
| 5,446,683 | A * | 8/1995 | Mullen et al. | 708/256 |
| 6,993,694 | B1 * | 1/2006 | Kapur et al. | 714/733 |
| 7,979,763 | B2 | 7/2011 | Wohl et al. | |
| 2003/0233607 | A1 * | 12/2003 | Appinger et al. | 714/728 |
| 2011/0231719 | A1 * | 9/2011 | Kim et al. | 714/729 |
| 2011/0307750 | A1 * | 12/2011 | Narayanan et al. | 714/729 |
| 2012/0030532 | A1 * | 2/2012 | Jain et al. | 714/726 |
| 2012/0126781 | A1 * | 5/2012 | Narayanan et al. | 324/76.11 |

OTHER PUBLICATIONS

Kinsman, Adam B. "Time-Multiplexed Compressed Test of SOC Designs", IEEE Trans. on VLSI Systems, vol. 18, Nov. 8, Aug. 2010, pp. 1159-1172.

* cited by examiner

*Primary Examiner* — Albert Decady
*Assistant Examiner* — Enam Ahmed
(74) *Attorney, Agent, or Firm* — Bever, Hoffman & Harms, LLP

(57) ABSTRACT

A scan test system and technique compresses CARE bits and X-control input data into PRPG seeds, thereby providing a first compression. The scan test system includes a plurality of compressor and decompressor structures (CODECs). Each block of the design includes at least one CODEC. An instruction decode unit (IDU) receives scan inputs and determines whether a seed extracted from the scan inputs is broadcast loaded in the CODECs, multicast loaded in a subset of the CODECs, or individual loaded in a single CODEC. This sharing of seeds, exploits the hierarchical nature of large designs with many PRPGs, provides a second compression. Results on large industrial designs demonstrate significant data and cycle compression increases while maintaining test coverage, diagnosability, and performance.

26 Claims, 13 Drawing Sheets

Scan input format 300

Broadcast 301

Scan input format 310

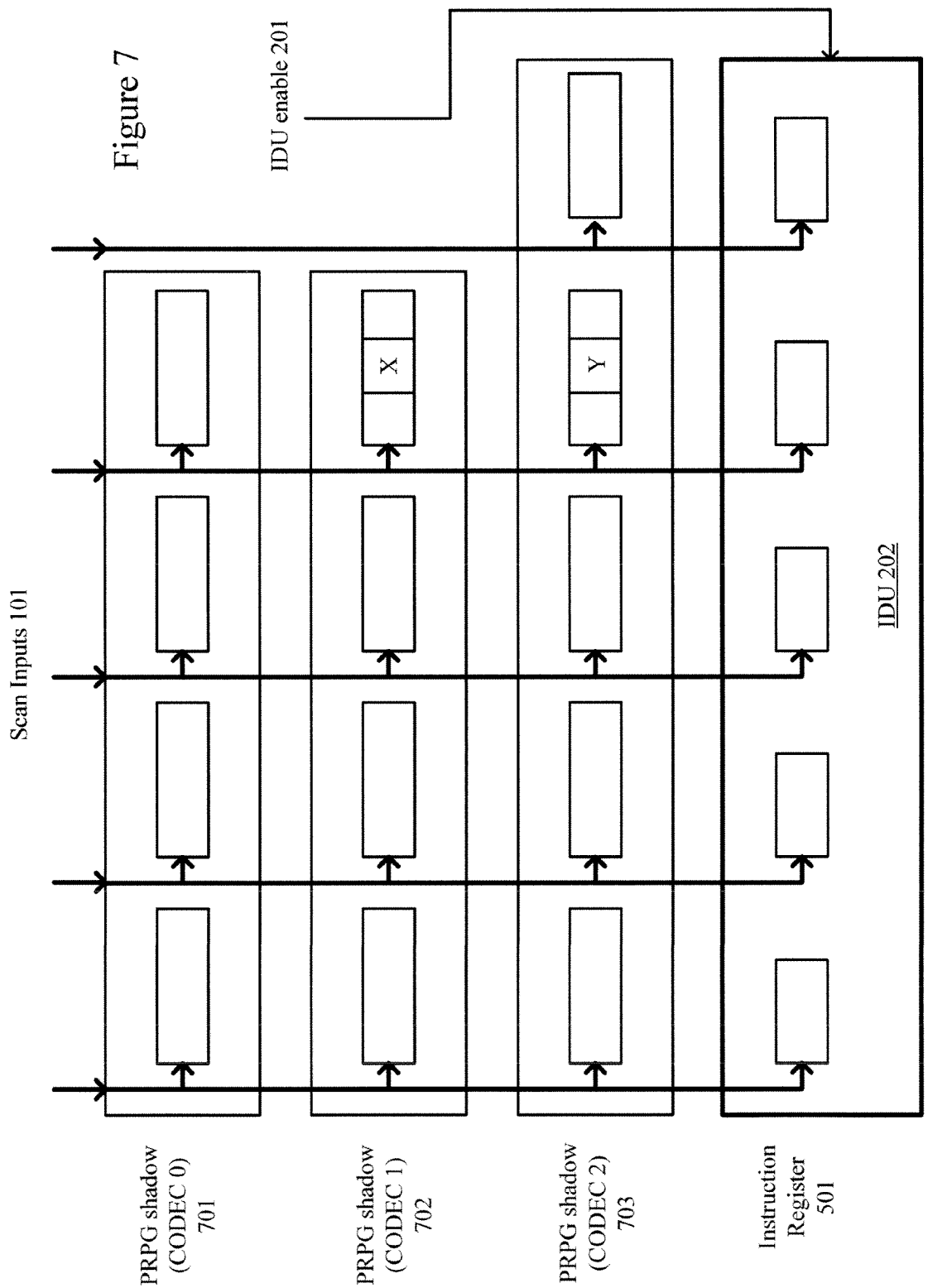

TWO-LEVEL COMPRESSION THROUGH SELECTIVE RESEEDING

BACKGROUND OF THE INVENTION

1. Overview

Pseudo-random pattern generators (PRPGs) providing two-level compression through selective reseeding are discussed. This compression and selective reseeding provide significant data and cycle compression increases compared to current compression schemes while maintaining test coverage, diagnosability, and performance.

2. Related Art

Larger and more complex logic designs in integrated circuits (ICs) lead to demands for more sophisticated testing to ensure fault-free performance of those ICs. This testing can represent a significant portion of the design, manufacture, and service cost of integrated circuits (ICs). In a simple model, testing of an IC can include applying multiple test patterns to the inputs of a circuit and monitoring its outputs to detect the occurrence of faults. Fault coverage indicates the efficacy of the test patterns in detecting each fault in a universe of potential faults. Thus, if a set of test patterns is able to detect substantially every potential fault, then fault coverage approaching 100% has been achieved.

To facilitate better fault coverage and minimize test cost, DFT (design-for-test) can be used. In one DFT technique, structures in the logic design can be used. Specifically, a logic design implemented in the IC generally includes a plurality of state elements, e.g. sequential storage elements like flip-flops. These state elements can be connected into scan chains of computed lengths, which vary based on the design. In one embodiment, all state elements in a design are scannable, i.e. each state element is in a scan chain. The state elements in the scan chains are typically called scan cells. In DFT, each scan chain includes a scan-input pin and a scan-output pin, which serve as control and observation nodes during the test mode.

The scan chains are loaded by clocking in predetermined logic signals through the scan cells. Thus, if the longest scan chain includes 500 scan cells, then at least 500 clock cycles are used to complete the loading process. Note that, in actual embodiments, software can compensate for different scan chain lengths, thereby ensuring that outputs from each test pattern are recognized and analyzed accordingly.

The test patterns for the scan chains can be generated using an external testing device. Using such a device, an exhaustive test can be done by applying $2^N$ input patterns to a design with N inputs and scan cells, wherein N is a positive integer. However, this test approach is commercially impractical as the number of inputs increases.

To solve this problem, deterministic automatic test pattern generation (ATPG) can be used to generate a smaller set of patterns while providing fault coverage close to 100%. Specifically, in deterministic ATPG, each test pattern is designed to test for as many faults as possible. However, even with the reduction in test patterns, deterministic ATPG patterns still require significant storage area in the test-application equipment (tester) for the large number of patterns that are input directly to the scan chains, and for the expected output values from the scan chains. Moreover, this test method has associated inefficiencies because of its off-chip access time.

Alternatively, and more frequently in current, complex ICs, structures can be added to the design to allow on-chip decompression of test stimuli and on-chip compression of test responses. These structures can include various pattern generators, the most typical being a pseudorandom pattern generator (PRPG). After the patterns generated by the PRPG are propagated through the scan chains in the tested design, the outputs are analyzed to determine if a fault is detected. An exemplary scan test system and technique using PRPG is described in U.S. Pat. No. 7,237,162, entitled "Deterministic BIST Architecture Tolerant Of Uncertain Scan Chain Outputs", which issued on Jun. 26, 2007 and is incorporated by reference herein.

To achieve high defect coverage during IC scan testing, particularly in light of shrinking process technologies and new IC materials, different fault models (e.g. stuck-at, transition delay, and shorts/opens models) may be used. Unfortunately, although test patterns for timing dependent and sequence dependent fault models are increasingly important for new technologies, such test patterns can require 2-5 times more tester time and data. Current increases in test data volume and test application time are projected to continue for at least an order of magnitude for next generation tools. Therefore, scan-alone scan testing has become insufficient as a method to control test costs. Even highly compacted vector sets generated with modern ATPG require on-chip compression and decompression to reduce test cost.

Scan compression lowers test cost by reducing test pattern volume, test application time, and tester pin count requirements. Techniques described below can advantageously increase scan input data compression while maintaining test coverage, test diagnosis, and hardware support.

SUMMARY OF THE INVENTION

A scan test system for testing a design implemented in an integrated circuit (IC) is described. The design includes a plurality of blocks and a plurality of scan chains. The scan test system includes a plurality of compressor and decompressor structures (CODECs). Each block includes at least one CODEC. Each CODEC includes at least a predetermined number of the plurality of scan chains. The system further includes an instruction decode unit (IDU) for receiving scan inputs and determining whether a seed extracted from the scan inputs is broadcast loaded in the plurality of CODECs, multicast loaded in a subset of the plurality of CODECs, or individual loaded in a single CODEC.

Another scan test system for testing a design implemented in an integrated circuit (IC) is described. In this system, each CODEC includes a set of the plurality of scan chains and a PRPG shadow for receiving the scan inputs. When enabled by the IDU, the PRPG shadow selectively loads the seed to one of a first PRPG processing chain and a second PRPG processing chain. The first PRPG processing chain can generate patterns for identifying faults of the design, wherein the patterns can be applied to the set of the plurality of scan chains. The second PRPG processing chain can generate X-tolerant (XTOL) control bits, which determine a level of observability of the set of the plurality of scan chains. An unload block can receive scan outputs from the set of the plurality of scan chains and the XTOL control bits, and generate test outputs for analyzing the design.

Any of the above-described scan test systems can include a plurality of CODEC enable lines coupling the IDU to the plurality of CODECs to enable seed loading. In one embodiment, the IDU is configured to determine whether a new address instruction or an increment address instruction, which is also extracted from the scan inputs, is applied to the plurality of CODECs. The new address instruction includes a CODEC address and a broadcast bit that determines whether the seed is multicast loaded in at least a subset of the plurality of CODECs or loaded to a single CODEC. Multicast loading uses the CODEC address and all CODECs having an address higher than the CODEC address. Multicast loading from CODEC address 0 is in effect broadcast loading to all CODECs. The increment address instruction, which has no overhead (i.e. has no bits for analysis), indicates multicast loading for CODEC addresses higher than the last-used CODEC address plus one. The IDU can be further configured to allow the scan inputs to overwrite the seed stored by one or more CODECs when receiving multiple instructions.

A scan test method for testing a design implemented in an IC is also described. The design includes a plurality of blocks, a plurality of scan chains, and a plurality of compressor and decompressor structures (CODECs). Each block includes at least one CODEC. The method includes receiving scan inputs and determining whether a seed extracted from the scan inputs is broadcast loaded in the plurality of CODECs, multicast loaded in a subset of the plurality of CODECs, or individual loaded in a single CODEC. Patterns for testing faults of the design can be generated using the seed as loaded. The patterns can be applied to the plurality of scan chains. X-tolerant (XTOL) control bits can be generated to determine a level of observability of the plurality of scan chains. Test outputs for analyzing the design can be generated using scan outputs from the plurality of scan chains and the XTOL control bits. The method can further include receiving an increment address instruction, which increments a previously-used address to generate an incremented address and enables all CODECs from the incremented address and higher.

BRIEF DESCRIPTION OF THE DRAWINGS

FIG. 7 illustrates an exemplary load configuration for four CODECs.

DETAILED DESCRIPTION OF THE DRAWINGS

Scan testing and scan compression have become key components for reducing test cost. High-compression schemes typically use pseudo-random pattern generators (PRPGs). As described in further detail below, an improved compression technique can increase PRPG-based compression by providing two-level compression through selective reseeding.

Scan load compression techniques exploit the scarcity of "CARE" bits (i.e. values stored in predetermined scan cells that can achieve detection of targeted faults) in scan input data compared to the "don't CARE" bits (i.e. those bits that are not required for detecting targeted faults in the tested design). Scan unload compression techniques exploit the fact that error values appear more or less randomly, and only on a few scan chains at a time. Specifically, the tested design can occasionally output uncertain bits in addition to CARE bits and don't CARE bits. As the name implies, an uncertain bit (called an "X" herein) has a value that is unknown (i.e. a value that cannot be accurately predicted by the simulation used during the ATPG process). As a result, X bits can corrupt the analysis of the scan outputs. Moreover, such X bits can limit unload compression by masking observation, and can also limit load compression by requiring additional input bits to prevent Xs or avoid their effect on scan outputs.

Figure 1:
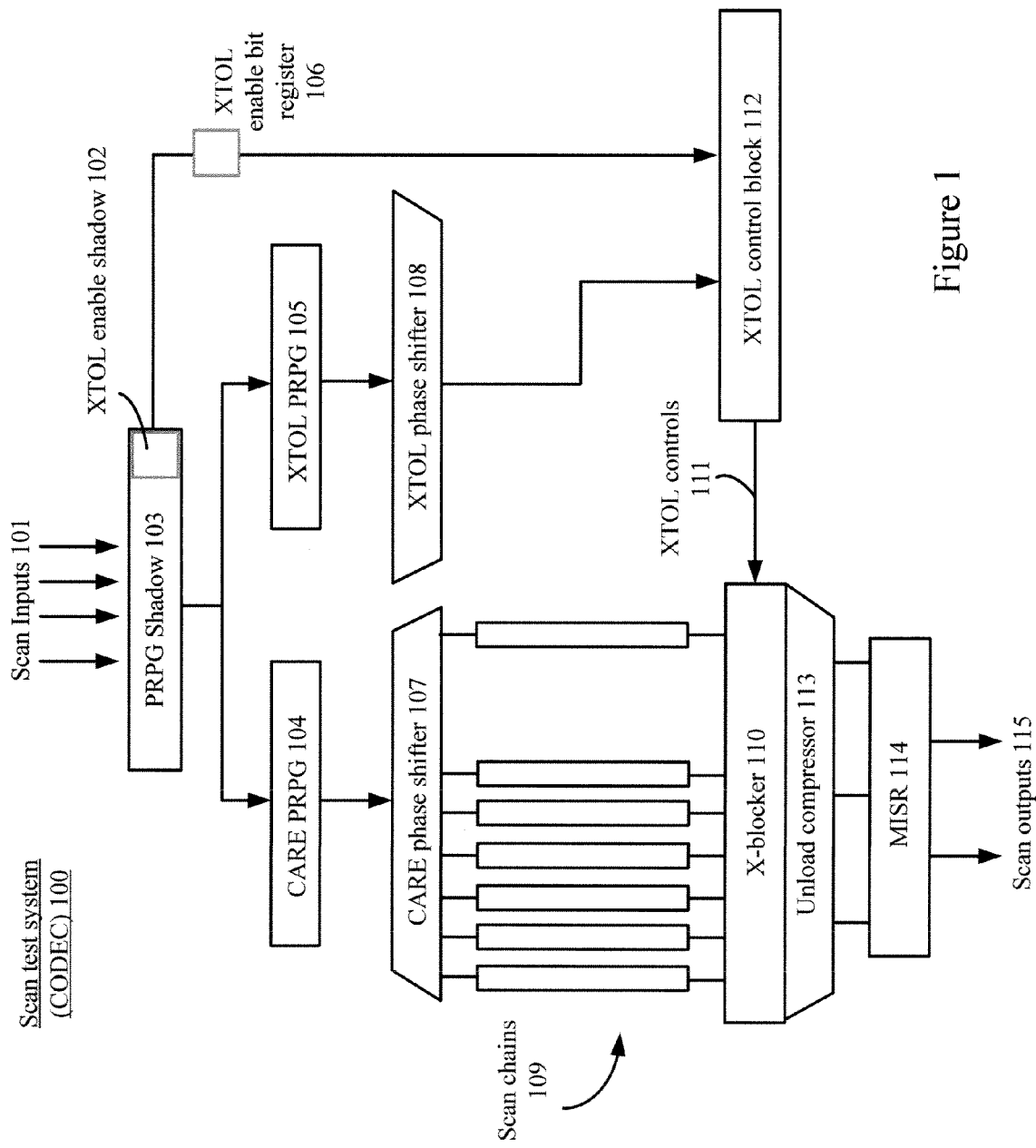
FIG. 1 illustrates an exemplary scan test system that can be used with two-level compression using selective reseeding.

FIG. 1 illustrates an exemplary scan test system 100 that can be used with two-level compression using selective reseeding as described below. In scan test system 100, both a CARE bit PRPG (CARE PRPG) 104 and an X-tolerant bit PRPG (XTOL PRPG) 105 are provided. Therefore, scan test system 100 can be characterized as a dual-PRPG architecture. CARE PRPG 104 can produce CARE (and don't CARE) bits and XTOL PRPG 105 can produce XTOL control bits. A PRPG shadow register 103 can receive scan inputs 101 (e.g. seeds) from a tester and generate appropriate seeds for either CARE PRPG 104 or XTOL PRPG 105. U.S. Pat. No. 7,979,763, entitled "Fully X-Tolerant, Very High Scan Compression Scan Test Systems And Techniques", issued on Jul. 12, 2011, and incorporated by reference herein, describes PRPG shadow register 103 and other components of scan test system 100 in greater detail. The dual-PRPG architecture ensures no dependency between the load of a CARE seed and the load of an XTOL seed for the overlapped X-tolerant unload of the previous pattern.

CARE PRPG 104 can provide its output to a CARE phase shifter 107, which can have more outputs than inputs. Thus, in combination, CARE PRPG 104 and CARE phase shifter 107 can provide load decompression for the CARE (and don't CARE) bits provided to a plurality of scan chains 109. In a contrasting configuration, XTOL PRPG 105 can provide its output to an XTOL phase shifter 108, which can include more inputs than outputs. Thus, in combination, XTOL PRPG 105 and XTOL phase shifter 108 can provide load compression for XTOL bits.

Note that a PRPG is effectively a shift register with a predetermined feedback configuration. Therefore, adjacent cells of the PRPG have a dependency on one another, i.e. a second cell that is downstream of a first cell can store a value that was previously stored by the first cell one clock before. Phase shifters, which are typically implemented using XOR gates that receive inputs from predetermined cells, can eliminate the linear dependency between adjacent cells of the PRPG so that fault detection is not deterred by the linear dependencies of the PRPG. The various configurations of a PRPG and a phase shifter are known to those skilled in the art of IC testing and therefore are not explained in detail herein.

In one embodiment, PRPG shadow register 103 includes an XTOL enable shadow register 102, which is a designated one-bit register for storing an XTOL enable bit. An additional XTOL enable bit register 106 is provided so that the XTOL enable bit can be used while PRPG shadow 103 is being reloaded. The stored XTOL enable bit is provided to an XTOL control block 112. An inactive XTOL enable bit can override the output of XTOL PRPG 105 during a window of adjacent X-free shift cycles. Note that this override can reduce compressed data volume by not requiring XTOL PRPG bits for a window of adjacent shift cycles that need no X control. In one embodiment, XTOL PRPG 105 can continue to shift, but its control over X-blocker 110 can be effectively disabled by XTOL control block 112. In contrast, when the XTOL enable bit is active, XTOL PRPG 105 and XTOL control block 112 can provide per-shift XTOL-controls to the X-blocking logic in X-blocker 110.

In one preferred embodiment, XTOL enable shadow bit 102 is provided to PRPG shadow register 103 as part of scan inputs 101. Thus, XTOL enable bit 106 can be changed only when either CARE PRPG 104 or XTOL PRPG 105 is reseeded. XTOL Enable bit 106 can significantly reduce XTOL bits for designs with very low X densities, but provides relatively coarse control. To further reduce XTOL bits for medium and high X densities, a finer control can also be provided. Notably, X distribution is highly uneven in most designs, thereby allowing the XTOL control bits to be re-used for adjacent cycles (and the pattern as generated by ATPG can be tuned to favor re-use). Therefore, in accordance with one embodiment, a dedicated channel of XTOL PRPG 105 can provide a Hold bit to XTOL control block 112 (as one output of XTOL phase shifter 108). This Hold bit ensures that the XTOL PRPG data in XTOL control block 112 is kept unchanged. XTOL control block 112 can use XTOL enable bit 106 and the output of XTOL phase shifter 108 to control X-blocker 110, which provides X-blocking of the outputs it receives from scan chains 109.

Note that while XTOL control block 112 provides constant XTOL control bits to X-blocker 110, XTOL PRPG 105 can advance to the next state when a new set of XTOL control bits is needed. In one embodiment, a single bit per shift is needed from XTOL phase shifter 108 to control XTOL control block 112. In one embodiment, the number of XTOL-control bits provided to X-blocker 110 is about log(# scan chains).

By using XTOL PRPG 105, scan test system 100 can ensure that no X's propagate to MISR (multiple-input shift register) 114, which receives compressed outputs (generated by unload compressor 113) from X-blocker 110. Thus, the scan cells selected to capture targeted fault effects (and any other non-X cells as practicable) can be efficiently observed in multiple input shift register (MISR) 114. MISR 114 provides a plurality of scan outputs 115 of scan test system 100.

Although ATPG tools are very efficient in merging multiple faults into a single test pattern (i.e. seed), only a small percentage of bits are actually CARE bits. In conventional scan testing, inputs other than CARE bits are assigned random values and then the entire test vector is loaded onto the tester. Compression techniques typically store only the CARE bits and fill-in the other bits through on-chip decompression hardware when the test is applied.

Notably, an IC design can be constructed by connecting pre-defined "cores" or "blocks" together, wherein a "core" could be a flip-flop, logic gate, or similar scale component and a "block" could be larger scale component. An IC designer can use these cores and blocks by accessing one or more libraries typically available via an electronic design automation (EDA) tool (described below in reference to FIG. 12). Indeed, many state-of-the-art industrial designs are built hierarchically from blocks, each block including one or more scan test systems (such as scan test system 100) therein. Because scan test system 100 includes both a compressor (i.e. unload compressor 113 and XTOL phase shifter 108) and a decompressor (i.e. CARE phase shifter 107), scan test system 100 will be called a CODEC (compressor/decompressor structure) herein for simplicity. Typical, large IC designs can have one hundred or more CODECs.

CARE bit needs can vary widely across blocks and test patterns, i.e. some blocks may require many CARE bits for some patterns whereas other blocks used in the same design may require only a few CARE bits in the same patterns; the reverse may hold for other patterns. Various attempts have been made to leverage this disparity to increase compression. For example, J. Janicki et. al., "EDT Bandwidth Management in SoC Designs", IEEE Trans. on CAD of Integrated Circuits and Systems, Vol. 31, No. 12, published on December 2012, distributes free variables by pattern (but not cycle) to reduce tester bandwidth. However, this distribution entails significant additional testing of the glue logic between cores, which necessitates more complex test resource partitioning. A similar approach described by A. B. Kinsman et al, in "Time-Multiplexed Compressed Test of SoC Designs", IEEE Trans. on VLSI Systems, Vol. 18, No. 8, published in August 2010, time-multiplexes tester channels to feed seeds to each core. The method described by Kinsman employs opportunistic reseeding and focuses on data (but not cycle) reduction. In "Multi-Level EDT to Reduce Sacne Channels in SoC Designs", Asian Test Symposium 2012, by G Li et al., free variables can be distributed by cycle and by pattern to increase compression, but a control signal must be added for each CODEC and the linear equation systems that must be solved increases with the number of CODECs. Therefore, the approach of Li does not scale up well for designs with hundreds of CODECs. A further drawback of previous compression methods is the need to add a significant number of control channels, i.e. on the order of the logarithm of the number of cores, which can be a non-trivial increase for IC designs with hundreds of blocks. Finally, previous methods have addressed average (not peak) CARE bits needed, and have not considered X-control input data.

The enhanced two-level compression scan test system and technique discussed below can advantageously reduce the scan inputs and test cycles compared to other known techniques, while retaining MISR-based output compression, thereby increasing both data and cycle compression. To provide this compression, the enhanced two-level compression scan test system and technique adds a single control channel, yet still considers all input data needs, i.e. CARE bits and X-controls, both average and peak.

As described in further detail below, top-level logic can determine which blocks consume which seeds (i.e. use the seeds for scan test). In one embodiment, scan input data is distributed to all CODECs in parallel and may contain both seed and seed destination information. An instruction decode unit (IDU) can be added at the top level of the design (i.e. in the hierarchy of the design, above the block level). The IDU can determine whether the seed is to be broadcast loaded in all CODECs, multicast loaded in a subset (at least two) of the total number of CODECs, or individual loaded in a single CODEC.

In other words, each seed is loaded only by the CODEC or CODECs for which it was computed. Advantageously, using all available scan inputs reduces the cycles needed to load a seed. Moreover, CODECs that do not need a new seed can continue to operate with their previous seed. In one embodiment, seeds can be computed to maximize sharing between CODECs, i.e. each seed providing as many CARE bits or X-control bits to as many CODECs as possible.

To minimize pattern count, ATPG merges as many faults as possible in every pattern. Merging effectiveness decreases as fewer and harder faults remain yet untested. As a result, initial patterns require a large number of CARE PRPG seeds, while later patterns need fewer and fewer seeds. Similarly, more capture clocks are used in early patterns, which can produce more unknown values than in later patterns, so the number of XTOL PRPG seeds can also decrease in later patterns. Both PRPGs can be repeatedly reseeded from the tester during test application to obtain the desired deterministic test. A new seed is loaded as often as needed.

Notably, the reseeding frequency of this dual-PRPG architecture is not limited by the number of cycles necessary to load a seed. For example, in one embodiment, the internal shift in scan chains 109 can be stopped if necessary to reseed either or both PRPGs from the tester (via PRPG shadow 103). PRPG shadow 103 can load the next CARE seed or XTOL seed while CARE PRPG 104 and XTOL PRPG 105, scan chains 109, and MISR 114 continue operating with the previously loaded seeds, thereby allowing reseed cycles to overlap with internal shift cycles. Once loaded, the content of PRPG shadow 103 can be transferred, in a single cycle, to either CARE PRPG 104 or XTOL PRPG 105. In one embodiment, when the content of PRPG shadow 103 is transferred to either PRPG, XTOL enable bit 106 (stored in XTOL enable shadow register 102) is also set, and remains unchanged until the next shadow transfer.

Figure 2:
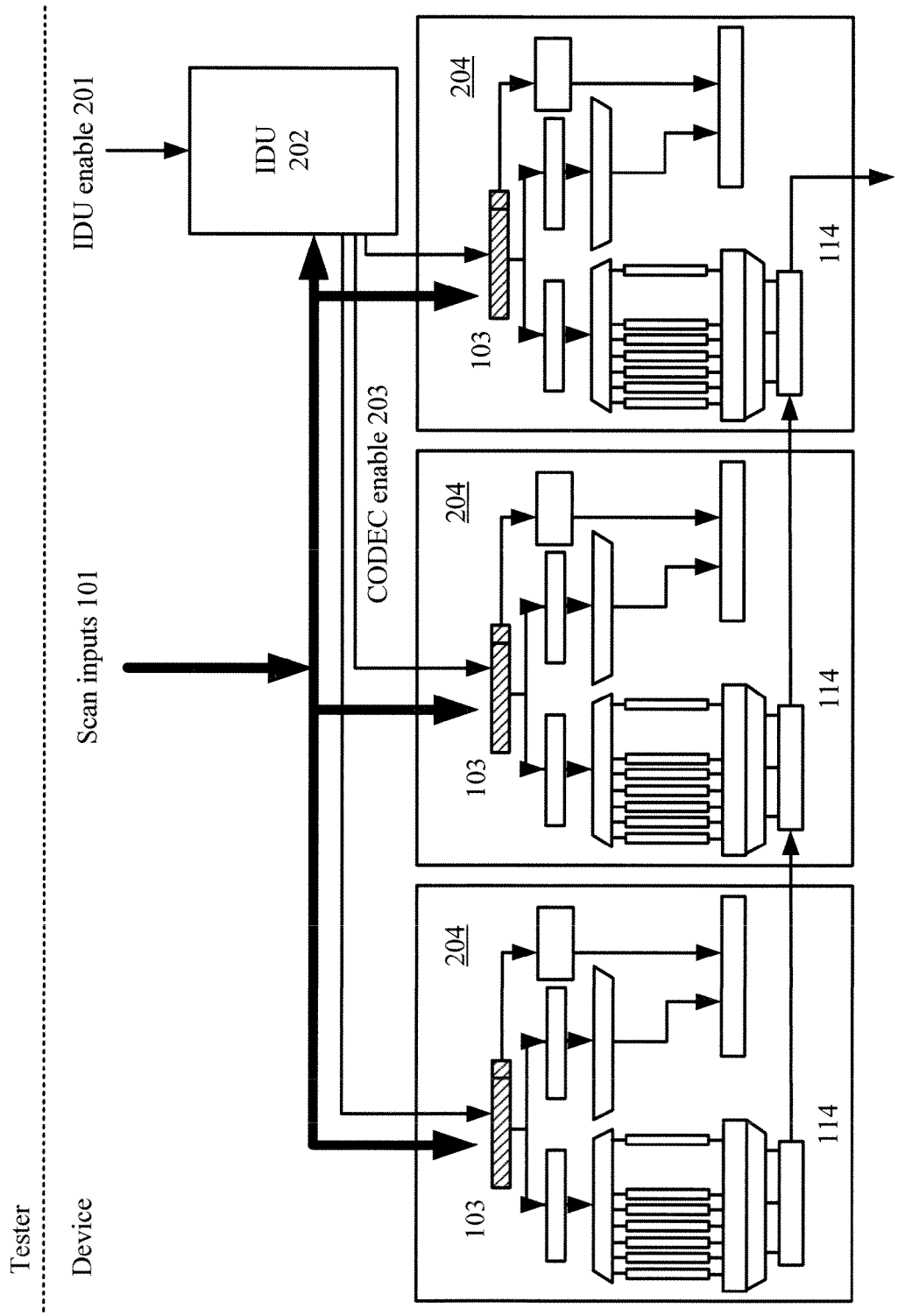
FIG. 2 illustrates an exemplary configuration including an IDU and a plurality of CODECs.

FIG. 2 illustrates an exemplary configuration including an IDU 202 and a plurality of CODECs 204. As shown, scan inputs 101 can be provided to all CODECs 204 as well as IDU 202. In one embodiment, an IDU enable signal is provided (by the tester) only to IDU 202. The PRPG shadow of each CODEC 204 (shown with a fill pattern), when activated by a CODEC enable signal 203, can load its seed in parallel through its scan input pins, thereby minimizing the reseed cycle count. However, the PRPG shadows do not need to use all inputs, so that blocks can easily be re-used in a bottom-up design flow, even if a new top-level has a different number of inputs than a reused block. For instance, a block can be designed with 8 inputs and later used in a top level design that has more than 8 inputs, so that 8 top-level inputs are shared with this block whereas other top-level inputs are not. The description below associated with FIG. 7 explains this use configuration in greater detail.

Scan inputs 101 may include instructions for IDU 202 and/or seed data. When both instructions and seed data are included, the instructions precede the seed data. IDU enable signal 201 is active in cycles that contain instructions. Moreover, in accordance with one aspect of the enhanced scan test system, an instruction set is designed and encoded so that IDU enable signal 201 by itself, even without instruction bits in scan inputs 101, can provide instruction to IDU 202 and subsequently to CODECs 204 (described in further detail below).

In one embodiment, IDU 202 can output a control bit for each CODEC 204, i.e. CODEC enable signal 203, which independently enables/disables loading of seed data. As soon as a new seed is received in scan inputs 101, CODEC enable signals 203 enable the targeted PRPG shadows to load those scan inputs, while others keep the previous seed. Note that this control is indicated on lines connecting IDU 202 to CODECs 204. Thus, CODEC enable signals 203, as shown in FIG. 2, can also be characterized as physical lines that facilitate the transfer of those signals. To allow IDU 202 to decode instructions on time, the IDU instruction packed with a seed determines the destination for the next seed (not the present seed, because insufficient time is available to respond in a timely manner). In one embodiment, the first seed in the pattern is always a CARE PRPG seed loaded by all CODECs 204.

In one embodiment, the following operations can proceed at the same time, in parallel: IDU 202 receives an instruction from the tester, any enabled PRPG shadows (either CARE PRPGs 104 or XTOL PRPGs 105) load a new seed from scan inputs 101, internal scan chains 109 load from CARE PRPGs 104, and internal scan chains 109 unload to MISR 114 (as determined by their XTOL PRPGs 105).

After reseeding of the PRPG shadows completes, the new seeds are transferred, in one cycle, to the corresponding CARE PRPGs 104 or XTOL PRPGs 105 so that the loading and unloading of scan chains 109 can continue. In one embodiment, when needed, scan shifting in scan chains 109 can be briefly paused to await completion of seed loading.

MISR 114 is typically unloaded once per pattern (wherein a plurality of patterns are generated by the seed as it propagates through scan chains 109), although unloads can be scheduled more frequent (e.g. to increase diagnosis resolution) or just once per test set (e.g. in self-test mode). In one embodiment, shown in FIG. 2, the MISRs 114 of CODECs 204 can be daisy-chained for the unload operation to accommodate the number of available pins and MISRs 114. In one embodiment, after unloading, MISRs 114 can reset to all zeros in preparation for the next pattern. In that case, the MISR unload is performed separately from, not in parallel with, the operations described above. Therefore, the MISR unload operation can use all available scan pins in output mode, while the reseed operation can use all available pins in input mode, during different cycles. Using more pins further reduces the number of cycles for each seed load and MISR unload.

Including instructions with seed data in scan inputs 101 allows efficient addressing of CODECs 204 to control the loading of each seed. Obtaining meaningful compression from shared and partial reseeding may require an efficient mechanism to address a subset of CODECs 204 for each seed. Simply adding an enable bit to each seed for each CODEC 204 would result in unacceptable overhead due to the large number of CODECs in current IC designs. Even addressing a single CODEC in a seed (which would significantly reduce ATPG compression) would undesirably add at least 7 bits to each seed data.

Figure 3A:
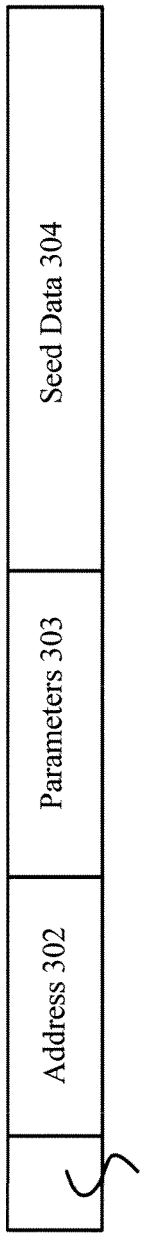
FIG. 3A illustrates an exemplary format for a new address (NewAddress) instruction.

To eliminate these disadvantages in one embodiment, an instruction set can be designed to include only two instructions: a new address (NewAddress) instruction and an increment address (IncrAddress) instruction. FIG. 3A illustrates an exemplary format 300 for a NewAddress instruction. As shown, format 300 includes a broadcast field 301, an address field 302, parameters field 303, and seed data field 304. As described above, the scan inputs may include instructions, seed data, and/or a combination of instructions and seed data. Therefore, the scan inputs may or may not include bits in each field.

In one embodiment, broadcast field 301 has a single bit. The broadcast bit of broadcast field 301 can determine whether the seed data is for one or multiple CODECs. For example, when the broadcast bit is "off" (i.e. has a first predetermined binary bit value), the seed destination is only the CODEC at the given address. In contrast, then the broadcast bit is "on" (i.e. has a second predetermined binary bit value), all CODECs from the given address and up load the seed data.

The address bits of address field 302 designate the CODEC (s) activated. Each CODEC is assigned a unique address. In one embodiment, this assignment is arbitrary and starts with zero (0). Unique addresses for the CODECs allow identification of which CODECs are activated by each CODEC enable signal. An exemplary new address instruction adds about two bytes of data to the seed.

Exemplary parameter bits of parameters field 303 can designate the type of seed (CARE vs. XTOL), a shift count (how many shift cycles the new seed is used), and other information. The seed bits of seed data field 304 include a single PRPG seed (CARE or XTOL).

Figure 3B:
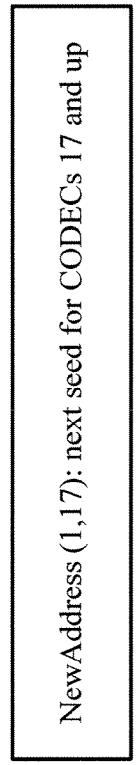
FIGS. 3B and 3C illustrate exemplary new address instructions in pseudo code.
Figure 3C:
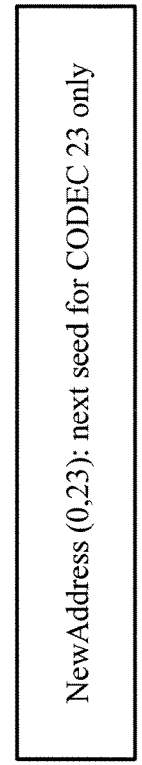

FIGS. 3B and 3C illustrate exemplary new address instructions in pseudo code. Note that in the figures showing instructions, the designation "(X,Y)" refers to the broadcast bit X and the address Y. In this embodiment, a broadcast bit of "0" is considered "inactive" (therefore, the seed will be loaded in a single CODEC), whereas a broadcast bit of "1" is considered "active" (therefore, the seed will be broadcast to all CODECs or multicast to a plurality of CODECs). Thus, in FIG. 3B, the instruction indicates that the next seed data (i.e. in the subsequent scan inputs) is for CODEC 17 and up (e.g. if the total number of CODECs is 100 and the numbering starts at 0, then the next seed data is for CODECs 17-99). In FIG. 3C, the instruction indicates that the next seed data is only for CODEC 23.

Figure 3D:
FIG. 3D illustrates an exemplary format for an increment address (IncrAddress) instruction.
Figure 3E:
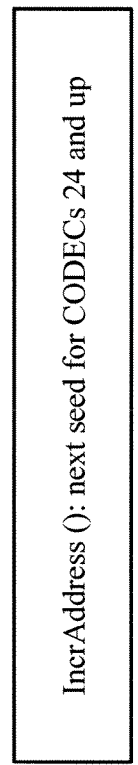
FIG. 3E illustrates an exemplary increment address instruction in pseudo code.

Compared to the new address instruction, the increment address instruction has no overhead. When the IDU receives an increment address instruction, the IDU will increment the previously used address and enable all CODECs from that address and up (i.e. load the seed into their respective PRPG shadows). FIG. 3D illustrates an exemplary format 310 for an increment address instruction. As noted in FIG. 3D, only seed data field 304 is included in this instruction. FIG. 3E illustrates an exemplary increment address instruction having "( )", i.e. no broadcast bit, address, or parameters. Assuming the last instruction received was the new address instruction shown in FIG. 3C (indicating the next seed is for CODEC 23), the increment address instruction of FIG. 3D indicates that the next seed is for CODECs 24 and up. In one embodiment, the IDU enable signal allows the IDU to distinguish between the two instruction types, i.e. the IDU enable signal is "1" in the last cycle of seed data; further, the IDU enable signal is "1" for a total of one cycle for an increment address instruction, and the IDU enable signal is "1" for more than 1 cycle for a new address instruction (refer to FIG. 6 for additional explanation). The IDU is also configured to extract the instruction data, i.e. the broadcast bit, address, and parameters, and ignore the seed data from the scan inputs. In contrast, the CODECs, when enabled, are configured to extract and load the seed data into their respective PRPG shadows while ignoring the instruction data.

In a preferred embodiment, when encoding PRPG seeds for shared and partial reseeding, the use of the new address instruction is minimized to reduce the total overhead. Thus, both the new address instruction and the increment address instruction determine the destination for the next seed. As noted above, the next seed is used to allow time for the IDU to decode the instruction.

A reseed segment includes one or more instructions and a transfer function. The first seed in every pattern is implicitly broadcast to all CARE PRPGs, i.e. implicitly preceded by NewAddress (1,0) and the seed type CARE PRPG. In this manner, each pattern starts afresh and does not depend on CARE PRPG values from the previous pattern.

Figure 4A:
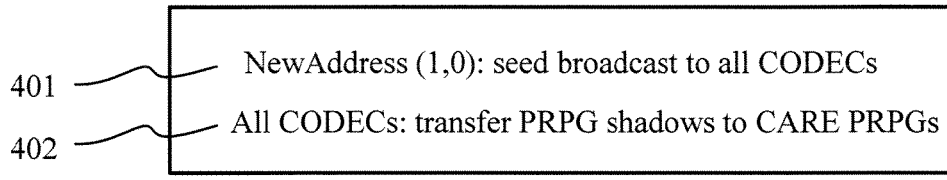
FIG. 4A illustrates a simple reseed segment including a single new address instruction.

For example, FIG. 4A illustrates a simple reseed segment including a single new address instruction. In this simple, example, per the new address instruction, all CODECs will be loaded with the same seed (401) (i.e. broadcast is on, from CODEC 0 and up). In this case, a transfer operation (402) indicates that all CODECs transfer the contents of their PRPG shadows to their respective CARE PRPGs. Note that the last instruction of a reseed segment is always NewAddress, which supplies parameters for the just loaded seed (e.g. the seed type (CARE or XTOL) and the number of internal shift cycles which will use the seed). Also, the last instruction of the reseed segment provides the broadcast bit and address (generically, (b, add); (1,0) for the embodiment described herein) for the first seed of the next reseed segment of the same pattern, if any.

Figure 4B:
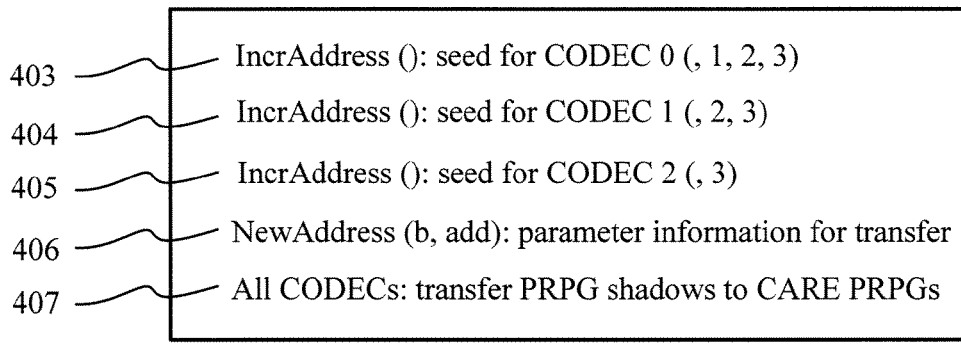
FIG. 4B shows how loading a separate seed in each CODEC can be achieved with minimal overhead using a few instructions.

FIG. 4B shows how loading a separate seed in each CODEC (common at the beginning of the pattern set) can be achieved with minimal overhead using a few instructions. Note that a new address instruction is already implicitly received. In this new address instruction, such as instruction 401, the seed computed for CODEC 0 is broadcast to all CODECs (assuming that there are only four CODECs 0-3). An instruction 403, a first incremental instruction, overwrites the PRPG shadows in CODECs 1, 2 and 3 (thereby leaving the seed intact in CODEC 0). An instruction 404, a second incremental instruction, overwrites the PRPG shadows in CODECs 2 and 3 (thereby leaving the seed intact in CODEC 0 and 1). An instruction 405, a third incremental instruction, overwrites the PRPG shadow in CODEC 3 (thereby leaving the seed intact in CODEC 0, 1 and 2). A new address instruction 406 includes parameter information, e.g. seed type (for CARE or XTOL PRPG), shift counter values, etc. At the end of the instructions stream, a transfer operation 407 transfers the now loaded seeds in CODECs 0-3 from their PRPG shadows to their respective CARE PRPGs (assuming that the increment instruction 406 designated a CARE seed type). This transfer operation can be controlled by the CODEC enable signals sent by the IDU to the CODECs (note that a CODEC enable signal can be an enabling signal or a disabling signal).

Figure 4C:
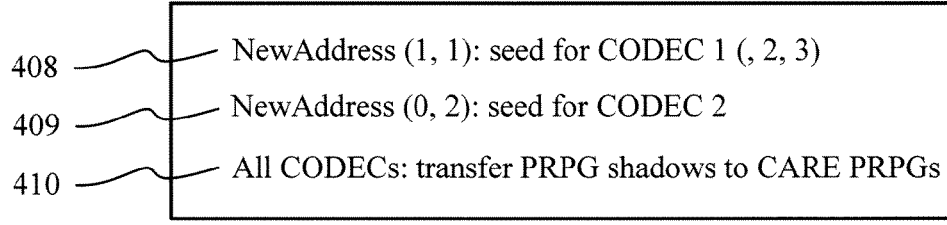
FIG. 4C illustrates a compact encoding for loading PRPGs.

FIG. 4C illustrates a compact encoding for loading the CARE PRPGs of CODECs 1 and 2 with independent seeds, and loading other CODECs with any seed. A first new address instruction 408 broadcasts the seed computed for CODEC 1 to all CODECs. A second new address instruction 409 has broadcast off and indicates the destination of the second seed is to be loaded only to CODEC 2. At the end of the instructions stream, a transfer operation 410 transfers the now loaded seeds in CODECs 0-3 from their PRPG shadows to their respective CARE PRPGs.

Figure 4D:
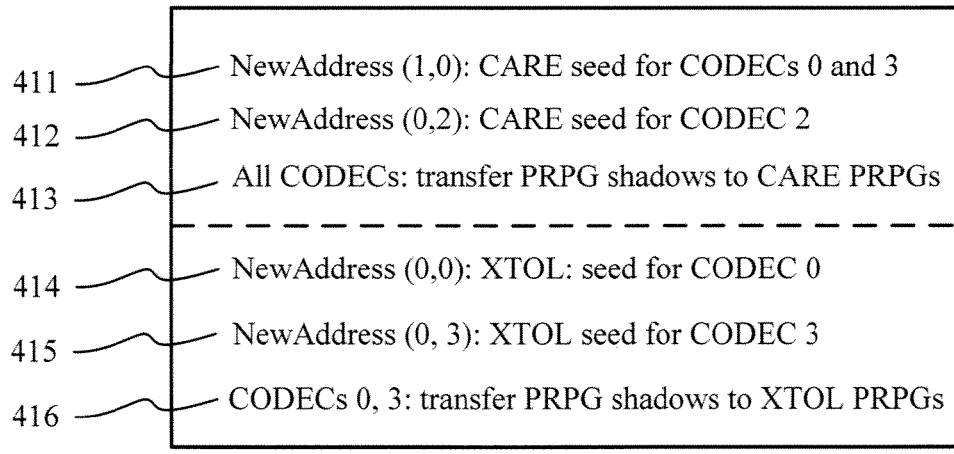
FIG. 4D illustrates two reseed operations for transferring CARE and XTOL seeds.

While FIGS. 4A-4C show examples of transferring only CARE PRPG seeds, an instructions stream can also include transferring XTOL seeds. For example, FIG. 4D illustrates two reseed operations for transferring CARE and XTOL seeds (see dashed line indicating respective instructions and transfer operations for these two reseed segments). In this example, the CARE PRPGs of CODECs 0 and 3 share a seed, the CARE PRPG of CODEC 2 has an independent seed, and the CARE PRPG of CODEC 1 has any seed. Additionally, the XTOL PRPGs of CODECs 0 and 3 have independent seeds, and the XTOL PRPGs of CODECs 1 and 2 have any seeds. The first new address instruction 411 loads a seed for CODECs 0 and 3 to all the CODECs. The second new address instruction 412 loads a seed only to CODEC 2. This reseed segment ends with a transfer operation 413, which transfers the loaded seeds in the PRPG shadows in CODECs 0-3 to their respective CARE PRPGs. The first new address instruction 414 in the second reseed segment loads seed data for CODEC 0 only. The second new address instruction 415 in the second reseed segment loads seed data for CODEC 3 only. The transfer operation 416 of the second reseed segment directs only CODECs 0 and 3 to transfer seeds from their PRPG shadows to their respective XTOL PRPGs. Thus, as described above, each reseed segment is directed to loading seeds into either CARE or XTOL PRPGs.

Note that the tester is not aware of the boundary between seeds or the distinction between seed data, instructions, or the IDU enable signal. That is, referring back to FIG. 2, from the view of a tester, there is just a continuous stream of tester data (generated by software), which includes scan inputs 101 and IDU enable signal 201, and is passed to the IDU and the scan test systems (CODECs). The IDU decodes the incoming scan inputs and, based on the IDU enable signal, enables the PRPG shadows in the selected CODECs to load seeds at the right time.

As described above, the CODEC instruction set can minimize the overhead of instructions data while allowing the flexible addressing of one or more CODECs. Additionally, the CODEC instruction set can minimize the overhead of seeding each CODEC with its own unique data (a situation common for initial patterns that can pack a large number of CARE bits). The CODEC instruction set can also minimize the overhead of seeding all but a few CODECs, each with its own data (a situation common in the tail end of the pattern set). Moreover, the decoding (i.e. generating the CODEC enable signals) is simple and requires minimal on-chip hardware.

Figure 5:
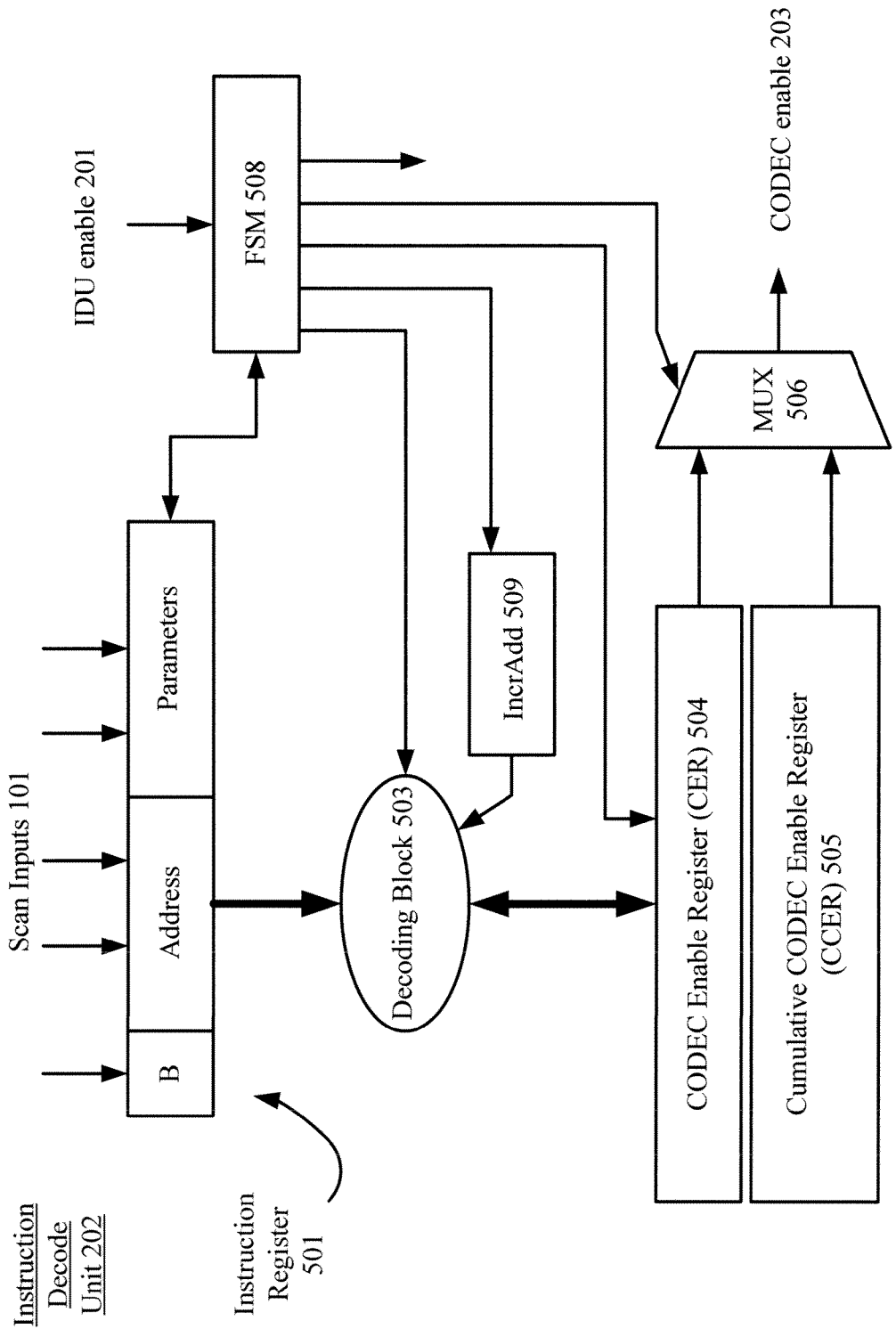
FIG. 5 illustrates an exemplary IDU.

FIG. 5 illustrates an exemplary IDU 202, which comprises an instruction register 501, a combinational decoding block 503, a CODEC enable register (CER) 504, and a cumulative CODEC enable register (CCER) 505. Instruction register 501 holds the scan inputs 101 needed by IDU 202, i.e. the broadcast bit, the address, and the parameters (as described above). CER 504 holds the latest decoded CODEC address provided by decoding block 503, whereas CCER 505 holds all decoded CODEC addresses for a reseed segment. In one embodiment, CER 504 and CCER 505 have the same number of bits, which corresponds to the number of CODECs in the design. In this configuration, each bit of the registers can be associated with a specific CODEC. Therefore, a predetermined bit value can indicate whether a CODEC is to be enabled or not. As described in further detail below, CCER 505 loads the bitwise OR of all CER values.

IDU 202 can further include a finite state machine (FSM) 508, which controls the operation of IDU 202 and seed usage. Specifically, IDU 202 triggers the transfer of the PRPG shadows to either CARE PRPGs or XTOL PRPGs via a shadow-transfer control shared by all CODECs. The CODEC enable signals 203 (one per CODEC) determine which CODECs perform this transfer (i.e. are enabled) and which do not transfer (i.e. are not enabled).

Also, the IDU includes a shift counter, which enables the PRPGs, the internal scan chains, and the MISRs to shift for a number of cycles included in the instruction parameters. If this shift count is less than the number of cycles needed to load the next reseed segment, the internal shift operation is stalled to wait for the next (CARE or XTOL) shift. Due to shared and partial reseeding, most reseed segments load far fewer seeds than the number of CODECs and thus require fewer cycles than reseeding all CODECs would, thereby reducing the number of stalled internal shift cycles.

In the configuration shown in FIG. 5, instruction register 501 loads the instruction bits of the new address instruction only (i.e. for the increment address instructions, instruction register 501 is not used), and a finite state machine (FSM) 508 sets an increment address (IncrAdd) register 509. Decoding block 503 transforms the binary-coded address (part of scan inputs 101) into a unary representation, with one bit per CODEC, which is loaded into CER 504. For example, for 4 CODECs, where CODEC address 0 is on the right, and based on the two consecutive instructions received below:

NewAddress (0,2): CER=0100; CCER=0100;
NewAddress (1,2): CER=1100; CCER=1100;

In this example, only the PRPG shadows of the CODECs whose CODEC enable signal is "1" load the seed data. Decoding block 503 is also configured to interpret the previous CER value for the increment address instructions. For example, based on the two consecutive instructions received below:

NewAddress (0,1): CER=0010; CCER=0010;
IncrAddress( ): CER=1100; CCER=1110;

Note that a multiplexer (MUX) 506 selects the outputs of CER 504 as CODEC enable signals 203 during reseed cycles while instruction register 501 loads the next address. MUX 506 selects the outputs of CCER 505 as CODEC enable signals 203 when the PRPG shadow contents are be transferred (at the end of a reseed segment), so that all PRPG shadows that loaded a new seed during any preceding instruction are now configured to use new PRPG seeds.

Figure 6A:
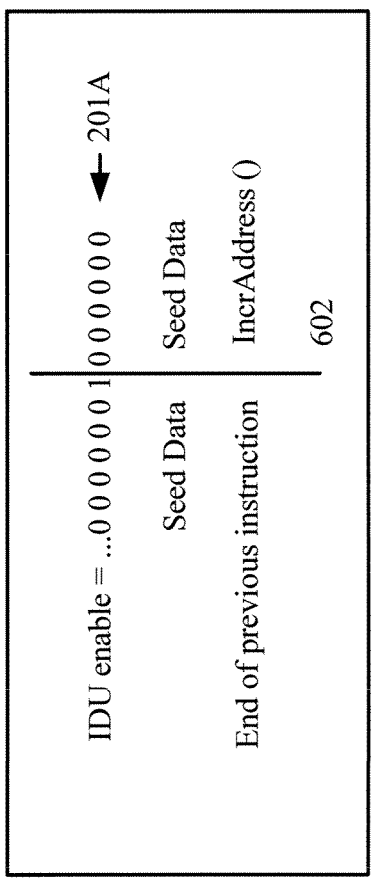
FIG. 6A shows an IDU enable signal that identifies the end of a previous instruction and an incoming increment address instruction.
Figure 6B:
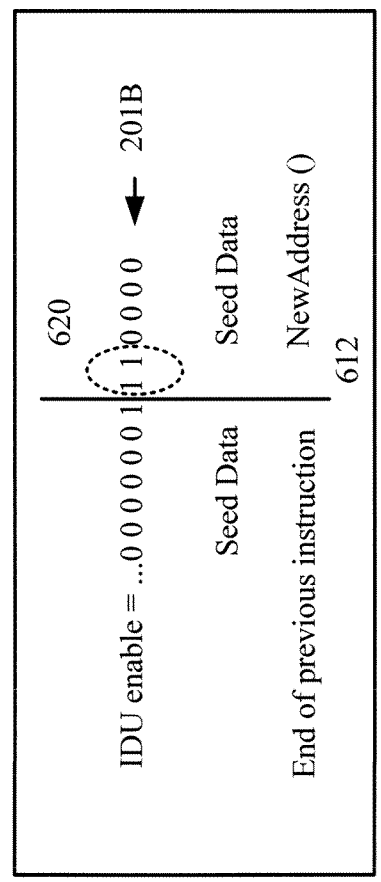
FIG. 6B shows an IDU enable signal that identifies the end of a previous instruction and an incoming new address instruction.

FSM 508 breaks down the incoming data stream (as provided by instruction register 501) into individual instructions and decodes them based on IDU enable signal 201. Specifically, the IDU enable signal is "1" in the last cycle of seed data, just preceding the next instruction data. FIG. 6A shows an IDU enable signal 201A that identifies the end of a previous instruction and an incoming increment address instruction, as shown by line 602 between the two instructions. Similarly, FIG. 6B shows an IDU enable signal 201B that identifies the end of a previous instruction and an incoming new address instruction, as shown by line 612 between the two instructions. The IDU enable signal also identifies whether the instruction is an increment address instruction or a new address instruction. For example, in the embodiment shown in FIGS. 6A and 6B, IDU enable signal 201B can include two "1"s at the beginning of the cycle that contain new address instructions. In all other cases, the IDU enable signal is "0". Note that in other embodiments, there could be a different number of "1"s at the beginning of the new address instruction (but at least one "1"), depending on the number of cycles needed to load the instruction.

Therefore, IDU enable signal 201 effectively encodes the two instruction types and delimits the cycles that contain new address data. In one embodiment, the CODECs enabled to load seed data also receive the bits of the new address instruction, but these bits precede the seed bits so the instruction bits can be shifted out of the PRPG shadows, thereby leaving the seed bits in their place. IDU 202, for its part, also receives seed bits, but only keeps the new address instruction bits, as directed by IDU enable signal 201.

Scan inputs 101 can be received by the PRPG shadows through as many pins as available, in parallel, to minimize load time. Therefore, in one embodiment, each PRPG shadow as well as the instruction register can be divided into segments, each segment being loaded concurrently from the scan input data stream. FIG. 7 illustrates an exemplary load configuration for four CODECs. In this configuration, scan inputs 101 can be provided concurrently to the segments of PRPG shadow 701 (for CODEC 0), PRPG shadow 702 (for CODEC 1), PRPG shadow 703 (for CODEC 2), and instruction register (IR) 501. Note that the total number of segments (in PRPG shadows 701-703 and instruction register 501) is less than or equal to the total number of scan input pins. As shown, the number of segments in these registers may vary. For example, in the configuration shown in FIG. 7, PRPG shadows 701 and 702 are divided into 4 segments while PRPG shadow 703 and instruction register 501 have 5 segments. The first four scan inputs 101 are shared by all CODECs 0-3 and IDU 202; however, the fifth scan input 101 is shared only by CODEC 2 and IDU 202, and the last scan input 101, IDU enable 201, is for IDU 202 only.

In one embodiment, unused inputs (if any) can be the last scan inputs, thereby ensuring that at least the first input is shared among all PRPG shadows and the instruction register. Thus, the XTOL enable bits of all CODECs can be loaded in parallel with the same values. This described configuration maximizes parallelism and minimizes the cycle count to load a seed and the cycle overhead to load the instruction register for a NewAddress instruction.

In addition to design rules checking (DRC) performed for scan designs, additional DRC can be added to ensure the correct functionality of the CODECs and the IDU so that patterns generated by ATPG are accurate. Except where otherwise noted, these additional checks can be performed by sequential event-driven simulation of the design, starting with the setup events and continuing with all relevant events. These additional DRC rules can be checked for both active and inactive conditions. In general, this checking can be achieved by storing the state of the design, setting the active condition, simulating and checking the effect on the target, then restoring the state and setting the inactive condition, and then simulating and checking the effect again. Note that in other embodiment, the inactive condition can be simulated and checked before the active condition.

Exemplary, additional DRC rules are described below. A first DRC rule can include identifying all CODECs and IDU registers (i.e. CERs and CCERs). (Note that the state registers of the FSM are not identified at this stage, but the functionality of the FSM through all states can be subsequently checked, as described below). A second DRC rule can include verifying that each CODEC enable signal properly enables and disables the PRPG shadow load and transfer. A third DRC rule can include verifying that the instruction register loads when IDU enable signal is active and holds when the IDU enable signal is inactive. A fourth DRC rule can include verifying that the increment address (509) register is properly set and holds during other events.

A fifth DRC rule can include verifying the address decode functionality using combinational parallel simulation of a plurality of random patterns (e.g. 32 patterns). The CER and CCER must be set to the decoded address value (considering the prior CER value, the instruction register address, the broadcast and IncrAdd register values) just prior to starting the reseed shift operation. The CER must be set to the decoded address value when the IDU enable signal transitions from 0 to 1 ("01"). The CCER must bitwise-OR the CER value over the previous CCER value when the IDU enable signal is "01". The CER and CCER values must hold when the IDU enable signal is "00" or "1x", wherein "X" indicates either "0" or "1".

A sixth DRC rule can include verifying the initial states before the reseed operation, i.e. address=0, broadcast=1, and IncrAdd register=0. A seventh DRC rule can include verifying the CER, CCER, and IncrAdd register operation for every 3-bit transition of the IDU enable (e.g. see FIGS. 6A and 6B for "0 1 0" transition). These checks can be performed by repeatedly storing the state of the design, setting the desired value of the IDU enable signal, performing sequential simulation and checking the targets, then restoring the state of the design and checking another IDU enable transition path. For example, for IDU_enable=101 (referring to the IDU enable signal), values of the IncrAdd register must hold, CER must be set to the decoded address value, and CCER must be set to the bit-wise OR cumulative value. For IDU_enable=010 (which can be obtained from the 101 state by setting IDU_enable to 0 and performing event-driven sequential simulation), the values of the IncrAdd register must be set to 1, and CER and CCER must hold.

An eighth DRC rule can include verifying that the instruction register value and the values of the IncrAdd register hold during shadow transfer operations. A ninth DRC rule can include verifying that the instruction register and the IncrAdd register hold during internal chain shifting when not overlapped with a reseed operation. A tenth DRC rule can include identifying the PRPG shadow segments and verifying the scan input sharing configuration (see, e.g. FIG. 7). An eleventh DRC rule can include identifying the instruction register segments and verifying the scan input sharing configuration (see, e.g. FIG. 7). A twelfth DRC rule can include verifying that all XTOL enable bits are directly loaded from the first shared scan input.

In addition to verifying the correct functionality of the CODECs and the IDU, DRC can identify and store relations important for ATPG, such as associating each CODEC with an address and determining the scan input sharing-information critical for seed sharing. For example, in one embodiment, the ATPG process can be modified to optimize and map test patterns to CARE and XTOL seeds. For each pattern, the test generator stores the desired CARE bits, which can be flagged as needed for the primary or secondary faults. A count is kept of the number of CARE bits per shift. Merging of the secondary faults is limited, per CODEC, by the maximum number of bits that can be satisfied in a single shift (which is equal to the length of the CARE PRPG less a small margin). The list of CARE bits is used to compute and store the required CARE seeds on a pattern by pattern basis. A binary search is repeatedly performed to find the maximal number of adjacent shift cycles for which all CARE bits can be satisfied by a single seed. At every step during the search, a solution for the linear system of CARE bits is sought. CARE bits flagged for the primary fault, if any, are given priority over secondary fault CARE bits because the primary fault is not re-targeted by the test generator. PRPG values computed from the seeds are loaded into the scan chains and fault simulation is performed. Secondary faults not detected because of dropped CARE bits are then re-targeted in future patterns.

Figure 8A:
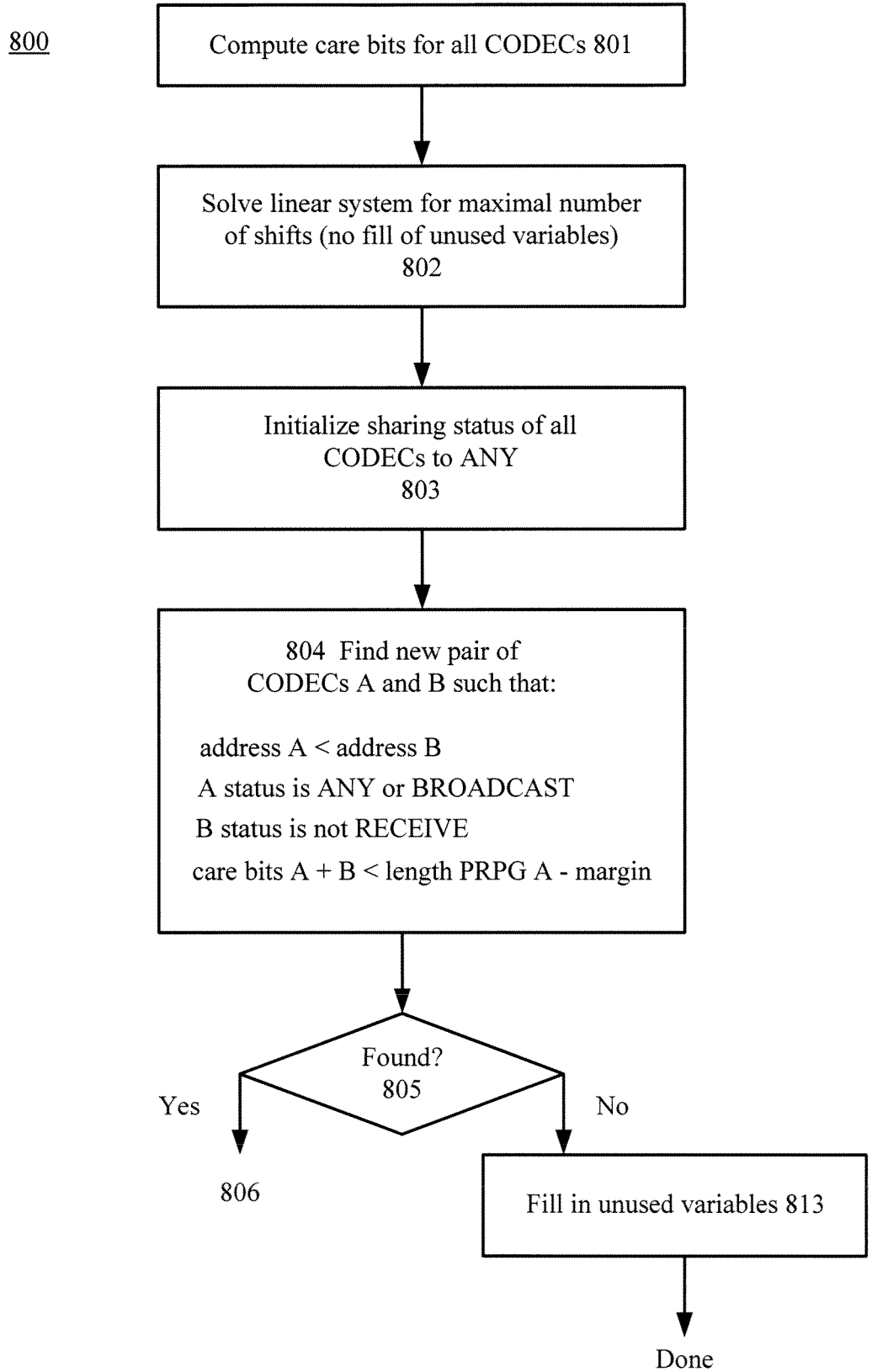
FIGS. 8A and 8B illustrates an exemplary technique for a shared and partial reseeding algorithm.
Figure 8B:
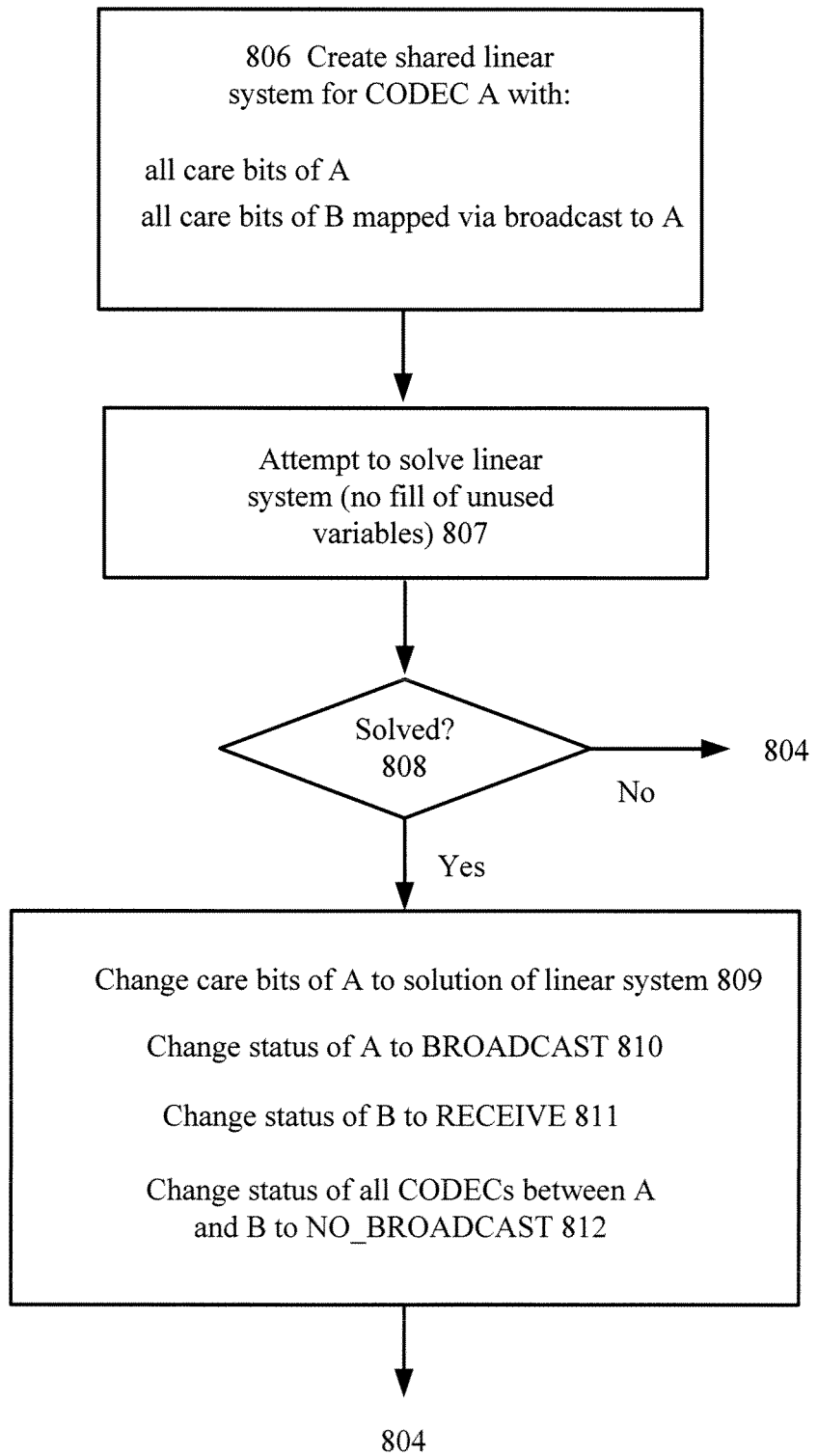

FIGS. 8A and 8B illustrates an exemplary technique 800 for a shared and partial reseeding algorithm. In step 801, care bits for the CODECs in the design can be computed. In step 802, a linear system for maximal number of shifts (with no fill of unused variables) can be solved. After a solution has been computed for the maximal window of adjacent shift cycles, a "hill-climbing" search is performed (steps 803-812) to find seed sharing opportunities for the window of shifts. Hill climbing is a mathematical optimization technique that finds a localized optimum. This technique begins with an arbitrary solution to a problem, then attempts to find a better solution by incrementally changing one element of the solution. In step 803, the sharing status of all CODECs is initialized to ANY. In step 804, starting from the lowest to the highest CODEC address, a candidate pair of CODECs is sought where a lower address CODEC (A) could broadcast to a higher address CODEC (B). Specifically, four conditions must be met: address A is less than address B, the status of A is ANY or BROADCAST, the status of B is not RECEIVE, and the sum of their CARE bits must be less than the length of the PRPG in A less some margin.

If the new pair of CODECs is found, then in step 806 a shared linear system can be formed with the CARE bits of A and the CARE bits of B mapped through the broadcast network to CARE bits of A. That is, bit y of B is mapped to bit x of A if x and y are loaded in the same cycle from the same scan input pin (see, FIG. 7). In step 807, a linear system solution (once again, no fill of unused variables) is attempted. If the shared linear system has no solution, as determined in step 808, then a new candidate pair is sought, i.e. the technique returns to step 804. If the shared linear system has a solution, then the linear system is updated by: replacing the CARE bits of A with the CARE bits of the shared linear system (step 809), changing the sharing status of A is to BROADCAST (step 810), changing the sharing status of B to RECEIVE (step 811), and changing the status of all CODECs with addresses between A and B to NO_BROADCAST (otherwise a broadcast from an address less than B would replace the shared seed that was already loaded in B when A was reseeded). Note that the CODECs between A and B are eligible to also share A's seed if their CARE bits can be solved in some future pass through the algorithm. At this point, technique 800 can return to step 804.

If the new pair of CODECs is not found in step 805, then the unused variables of all CODECs are filled in with random values in step 813 and the solution found in step 802 is translated to a string of instructions. Seeds loaded for CODECs with status NO_BROADCAST must be paired with NewAddress instructions (see, FIG. 3). Seeds loaded for CODECs with status BROADCAST can use either instruction, but IncrAddress is preferred if applicable. CODECs with status RECEIVE do not have associated instructions, rather, they are reseeded from a broadcast of a seed at a lower address. Finally, CODECs that need no CARE bits retain their PRPG value, unless a lower address CODEC with a BROADCAST status updates their seed too.

After patterns have been generated and mapped to CARE seeds, simulation can be performed to determine, based on the values loaded from the CARE PRPG, which scan cells capture targeted faults and which cells capture Xs. This information is then used to compute XTOL seeds for each pattern. For every pattern and every shift, the XTOL control block of every CODEC selects a subset of scan chains so that five conditions are met. The first condition is that no Xs are passed through to the unload compressor. The second condition is that the primary target fault, if any, is observed. The third condition is that as many secondary targets as possible are also observed. The fourth condition is that as many non-targeted cells as possible are observed. The fifth condition is that as few XTOL bits as possible are required.

Similarly to CARE PRPG seeds, XTOL seeds can be computed and shared using technique 800 (FIG. 8). In one embodiment, XTOL seeds of a pattern can be interleaved with the CARE seeds of the next pattern, so the last instruction of a reseed always provides the address for the first instruction of the next reseed (see, FIG. 4D).

Figure 9:
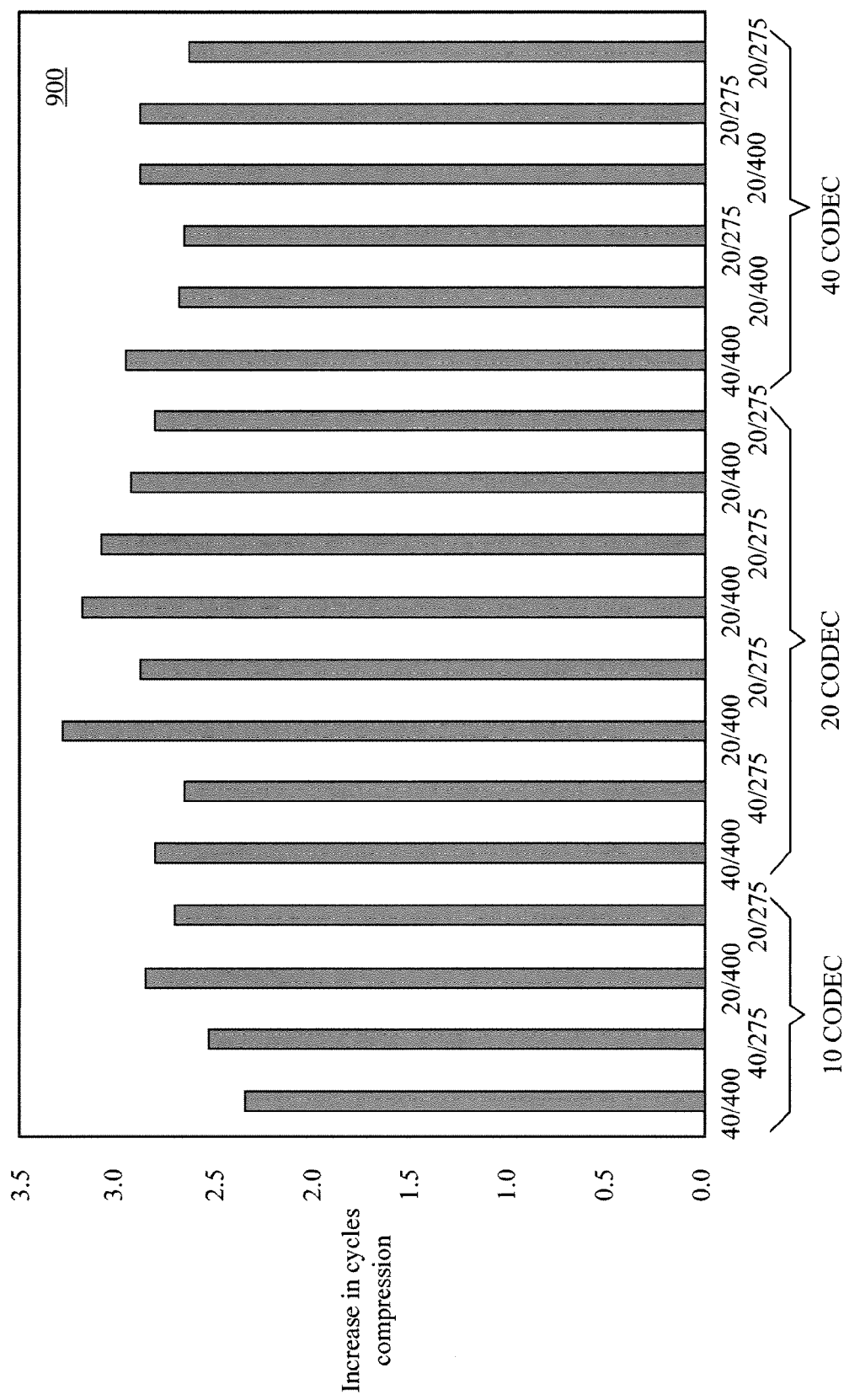
FIGS. 9-11 are bar charts indicating tester cycles improvement, tester data compression increase, and CPU time reduction over a previous compression method.

The enhanced, two-level scan compression method was analyzed with respect to 18 industrial designs ranging from 15M to 120M gates, configured with 10, 20, or 40 CODECs (the number of CODECs increasing with design size). Tester cycles improvement over the previous compression method is shown by bar chart 900 in FIG. 9. The design configuration, on the horizontal axis, shows the number of CODECs (i.e. 10, 20, or 30), the number N of inputs (and outputs), and the length L of internal chains (in the format N/L). All 18 designs have a significant X-density; however, some designs are available in "basic", "low" and "high" configurations, referring to their X-densities. In all 18 designs, the internal chains were identical for the previous and enhanced compression architectures, as were the number of external pins. The enhanced method uses all pins in either input mode (for reseed) or output mode (for MISR unload), whereas the previous method overlaps load and unload. As shown by FIG. 9, the enhanced method reduced tester cycles by 2.5 to 3×, with consistently higher reduction for larger designs.

Figure 10:
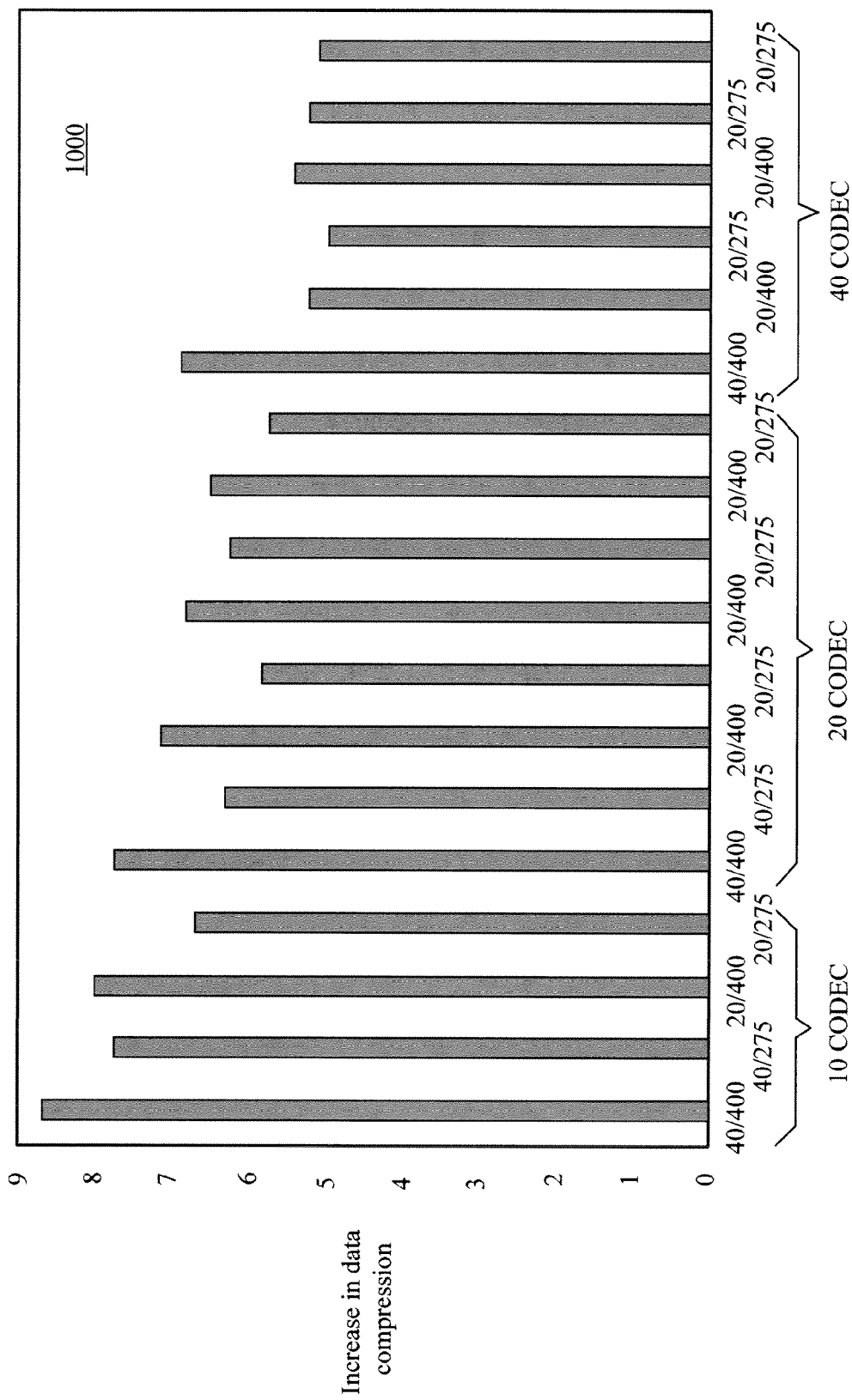

FIG. 10 is a bar chart 1000 showing tester data compression increase for the same 18 designs using the enhanced method. Notably, an additional compression of 5× up to approximately 9× was measured for all 18 designs and configurations compared to the compression provided by the previous method (which was state-of-the-art). Note that larger designs already provide high compression vs. scan; therefore, the enhanced method provided an increase of approximately 5× compared to the previous compression method.

Figure 11:
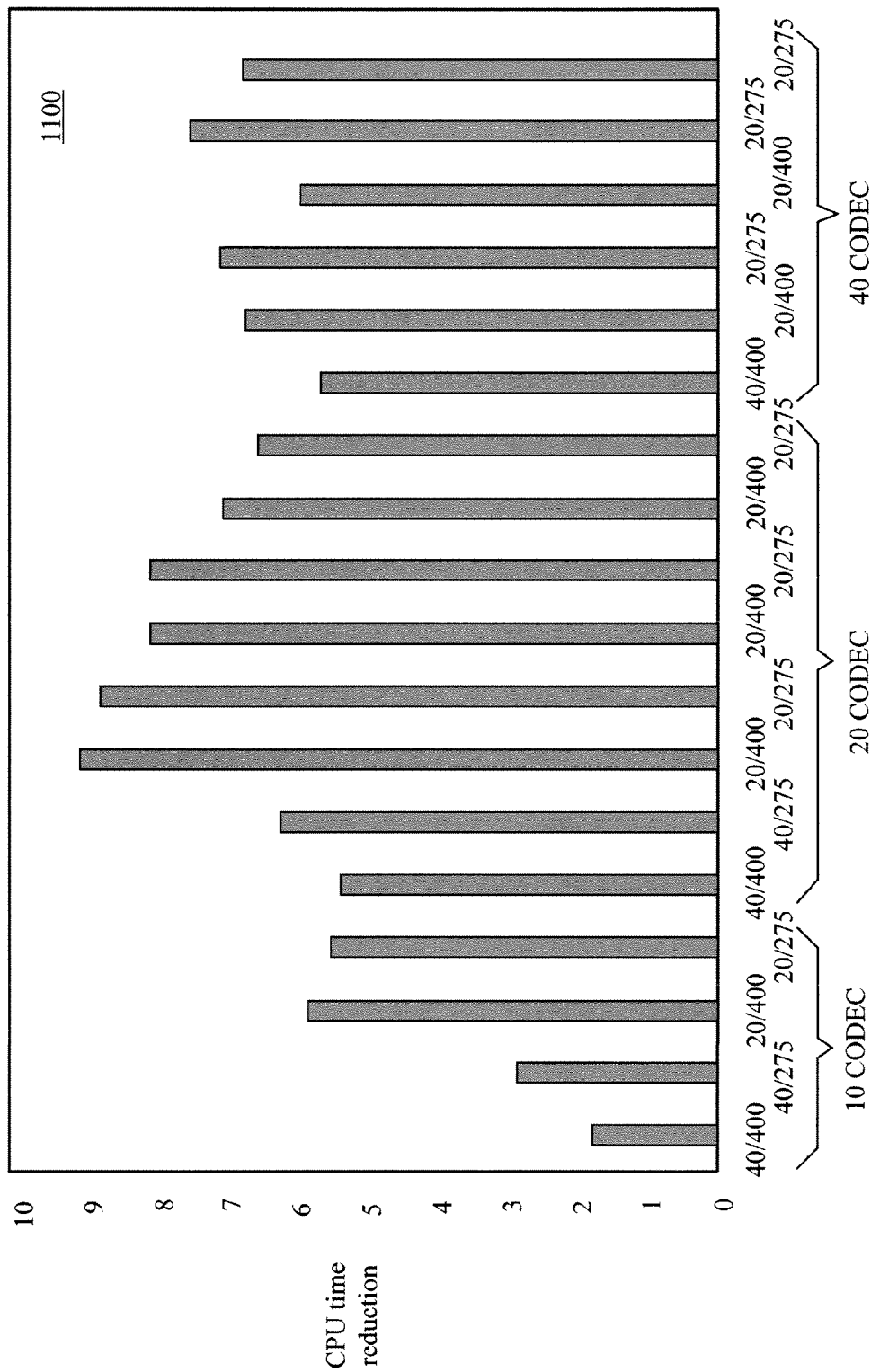

FIG. 11 is a bar chart 1100 showing CPU time reduction for the same 18 designs and configurations using the enhanced method compared to the previous method. The CPU reduction is due to the fast mapping of CARE and X-control bits into seeds vs. including compressor dependencies in the test generation search space. Mapping seeds into shared and partial seeds and instructions added a de minimis amount of CPU time.

Figure 12:
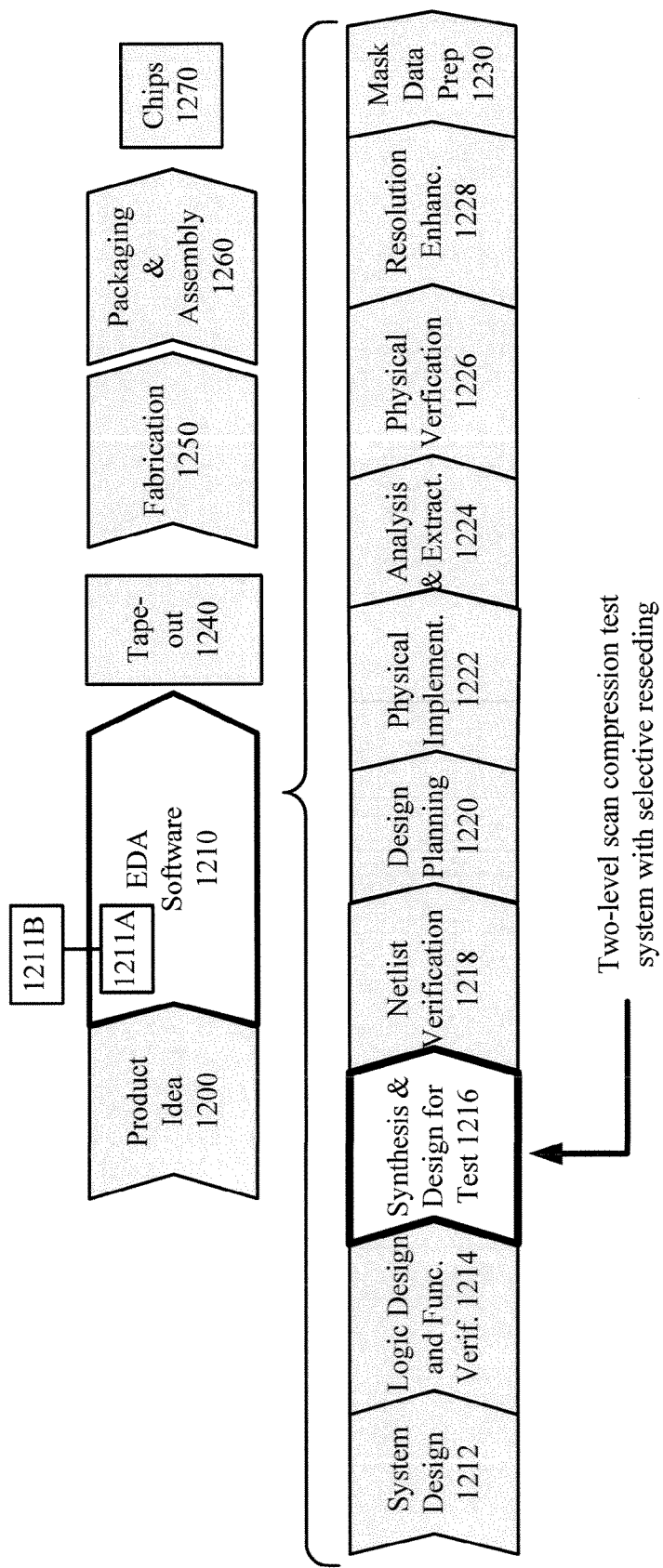
FIG. 12 shows a simplified representation of an exemplary digital ASIC design flow including the above-described two-level scan compression technique.

FIG. 12 shows a simplified representation of an exemplary digital ASIC design flow including the above-described two-level scan compression technique. At a high level, the process starts with the product idea (step 1200) and is realized in an EDA software design process (step 1210). When the design is finalized, it can be taped-out (event 1240). After tape out, the fabrication process (step 1250) and packaging and assembly processes (step 1260) occur resulting, ultimately, in finished chips (result 1270).

The EDA software design process (step 1210) is actually composed of a number of steps 1212-1230, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components/steps of the EDA software design process (step 1210) will now be provided. In one embodiment, one or more steps of the EDA software design process can be implemented using a computer-readable medium 1211A, which is read by a computer 1211B. Note that Astro, AstroRail, CustomSim, ESP, Hercules, IC Compiler, Magellan, Model Architect, Power Compiler, PrimeRail, Proteus, ProteusAF, PSMGen, Saber, StarRC, and System Studio are trademarks of Synopsys, Inc., and CATS, DesignWare, Design Compiler, Formality, HSIM, Leda, NanoSim, Primetime, Syndicated, TetraMAX, VCS, and Vera are registered trademarks of Synopsys, Inc.

System design (step 1212): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect™, Saber™, System Studio™, and DesignWare® products.

Logic design and functional verification (step 1214): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include HSIM®, NanoSim®, CustomSim™, VCS®, VERA®, DesignWare, Magellan™, Formality®, ESP and LEDA® products.

Synthesis and design for test (step 1216): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler™, Tetramax®, and DesignWare® products. In one embodiment, the above-described two-level scan compression technique can be used during step 1316.

Netlist verification (step 1218): At this step, the netlist is checked for compliance with timing constraints and for correspondence with the VHDL/Verilog source code. Exemplary EDA software products from Synopsys, Inc. that can be used at this step include Formality®, PrimeTime™, and VCS® products.

Design planning (step 1220): Here, an overall floorplan for the chip is constructed and analyzed for timing and top-level routing. Exemplary EDA software products from Synopsys, Inc. that can be used at this step include Astro™ and IC Compiler™ products.

Physical implementation (step 1222): The placement (positioning of circuit elements) and routing (connection of the same) occurs at this step. Exemplary EDA software products from Synopsys, Inc. that can be used at this step include the Astro™ and IC Compiler™ products.

Analysis and extraction (step 1224): At this step, the circuit function is verified at a transistor level, this in turn permits what-if refinement. Exemplary EDA software products from Synopsys, Inc. that can be used at this step include Astro-Rail™, PrimeRail™, Primetime®, and Star RC/XT™ products.

Physical verification (step 1226): At this step various checking functions are performed to ensure correctness for: manufacturing, electrical issues, lithographic issues, and circuitry. Exemplary EDA software products from Synopsys, Inc. that can be used at this step include the Hercules™ product.

Resolution enhancement (step 1228): This step involves geometric manipulations of the layout to improve manufacturability of the design. Exemplary EDA software products from Synopsys, Inc. that can be used at this step include Proteus™, ProteusAF™, and PSMGen™ products.

Mask data preparation (step 1230): This step provides the "tape-out" data for production of masks for lithographic use to produce finished chips. Exemplary EDA software products from Synopsys, Inc. that can be used at this step include the CATS® family of products.

The two-level scan compression technique can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

The invention claimed is:

1. A scan test system for testing a design implemented in an integrated circuit (IC), the design including a plurality of blocks and a plurality of scan chains, the system comprising:
   a plurality of compressor and decompressor structures (CODECs);
   an instruction decode unit (IDU) configured to receive scan inputs from a tester, to determine whether a seed extracted from the scan inputs is broadcast loaded in the plurality of CODECs, multicast loaded in a subset of the plurality of CODECs, or individual loaded in a single CODEC, and to transmit one or more CODEC enable signals to said the plurality of CODECs,
   wherein said plurality of CODECs are connected in parallel to the tester such that each said CODEC receives said seed, and wherein said block includes at least one CODEC, each CODEC including:
   a set of the plurality of scan chains;
   a first pseudo-random pattern generator (PRPG) processing chain configured to use the seed to generate patterns for identifying faults of the design, the patterns being applied to the set of the plurality of scan chains;
   a second PRPG processing chain configured to generate X-tolerant (XTOL) control bits, the XTOL control bits determining a level of observability of the set of the plurality of scan chains;
   a PRPG shadow configured to receive the scan inputs and to selectively load the seed, when enabled by an associated said CODEC enable signal transmitted from the IDU, to one of the first PRPG processing chain and the second PRPG processing chain; and
   an unload block configured to receive scan outputs from the set of the plurality of scan chains and the XTOL control bits, and to generate test outputs for analyzing the design.

2. The scan test system of 1, further including a plurality of CODEC enable lines coupling the IDU to the plurality of CODECs.

3. The scan test system of 1, wherein the IDU is configured to determine whether a new address instruction or an increment address instruction is applied to the plurality of CODECs based on the scan inputs.

4. The scan test system of 1, wherein the IDU is configured to decode a new address instruction, the new address instruction including a broadcast bit that determines whether the seed is multicast loaded in at least a subset of the plurality of CODECs or loaded to a single CODEC.

5. The scan test system of 1, wherein the IDU is configured to decode an increment address instruction, the increment address instruction indicating multicast loading for CODEC addresses higher than a last-used CODEC address.

6. The scan test system of 1, wherein the IDU is further configured to allow the scan inputs to overwrite the seed stored by one or more CODECs when receiving multiple instructions.

7. A scan test system for testing a design implemented in an integrated circuit (IC), the design including a plurality of blocks, the design including a plurality of scan chains, the system comprising:
  a plurality of compressor and decompressor structures (CODECs);
  an instruction decode unit (IDU) configured to receive scan inputs from a tester, to determine whether a seed extracted from the scan inputs is broadcast loaded in the plurality of CODECs, multicast loaded in a subset of the plurality of CODECs, or individual loaded in a single CODEC, and to transmit one or more CODEC enable signals to said the plurality of CODECs,
  wherein said plurality of CODECs are connected in parallel to the tester such that each said CODEC receives said seed, and wherein each block includes at least one CODEC, each CODEC including:
    a pseudo-random pattern generator (PRPG) shadow configured to receive the scan inputs and, when enabled by an associated said CODEC enable signal transmitted from the IDU, selectively providing the seed to either a first processing chain or a second processing chain, the first processing chain for generating patterns to identify faults of the design, the patterns being applied to a set of the plurality of scan chains, the second processing chain for generating X-tolerant (XTOL) control bits, the XTOL control bits determining a level of observability of the set of the plurality of scan chains; and
    an unload block for receiving scan outputs from the set of the plurality of scan chains and the XTOL control bits, and generating test outputs for analyzing the design.

8. The scan test system of 7, further including a plurality of CODEC enable lines coupling the IDU to the plurality of CODECs.

9. The scan test system of 7, wherein the IDU is configured to determine whether a new address instruction or an increment address instruction is applied to the plurality of CODECs based on the scan inputs.

10. The scan test system of 7, wherein the IDU is configured to decode a new address instruction, the new address instruction including a broadcast bit that determines whether the seed is multicast loaded in at least a subset of the plurality of CODECs or loaded to a single CODEC.

11. The scan test system of 7, wherein the IDU is configured to decode an increment address instruction, the increment address instruction indicating multicast loading for CODEC addresses higher than a last-used CODEC address.

12. The scan test system of 7, wherein the IDU is further configured to allow the scan inputs to overwrite the seed stored by one or more CODECs when receiving multiple instructions.

13. A scan test system for testing a design implemented in an integrated circuit (IC), the design including a plurality of blocks and a plurality of scan chains, the system comprising:
  a plurality of compressor and decompressor structures (CODECs), wherein each block includes at least one CODEC configured to receive scan inputs in parallel, each CODEC including at least a predetermined number of the plurality of scan chains; and
  an instruction decode unit (IDU) configured to receive said scan inputs, to determine whether a seed extracted from the scan inputs is broadcast loaded in the plurality of CODECs, multicast loaded in a subset of the plurality of CODECs, or individual loaded in a single CODEC, and to transmit one or more CODEC enable signals to said the plurality of CODECs, wherein each said CODEC loads said seed only after receiving an associated said CODEC enable signal.

14. The scan test system of 13, further including a plurality of CODEC enable lines coupling the IDU to the plurality of CODECs.

15. The scan test system of 13, wherein the IDU is configured to determine whether a new address instruction or an increment address instruction is applied to the plurality of CODECs based on the scan inputs.

16. The scan test system of 13, wherein the IDU is configured to decode a new address instruction, the new address instruction including a broadcast bit that determines whether the seed is multicast loaded in at least a subset of the plurality of CODECs or loaded to a single CODEC.

17. The scan test system of 13, wherein the IDU is configured to decode an increment address instruction, the increment address instruction indicating multicast loading for CODEC addresses higher than a last-used CODEC address.

18. The scan test system of 13, wherein the IDU is further configured to allow the scan inputs to overwrite the seed stored by one or more CODECs when receiving multiple instructions.

19. A scan test method for testing a design implemented in an integrated circuit (IC), the design including a plurality of blocks, a plurality of scan chains, and a plurality of compressor and decompressor structures (CODECs), wherein each block includes at least one CODEC, the method comprising:
  receiving scan inputs and determining whether a seed extracted from the scan inputs is broadcast loaded in the plurality of CODECs, multicast loaded in a subset of the plurality of CODECs, or individual loaded in a single CODEC;
  individually controlling each of the plurality of CODECs such that all of said CODECs load said seed when broadcast loaded, such that a subset of said CODECs load said seed when multicast loaded, and a single said CODEC loads said seed when individual loaded;
  generating patterns for identifying faults of the design using the seed as loaded;
  applying the patterns to the plurality of scan chains;
  generating X-tolerant (XTOL) control bits to determine a level of observability of the plurality of scan chains; and
  generating test outputs for analyzing the design using scan outputs from the plurality of scan chains and the XTOL control bits.

20. The method of claim 19, further including receiving a new address instruction including a broadcast bit, the broadcast bit determining whether the seed is multicast loaded in at least a subset of the plurality of CODECs or loaded to a single CODEC.

21. The method of claim 19, further including receiving an increment address instruction, the increment address instruction indicating multicast loading for CODEC addresses higher than a last-used CODEC address.

22. The method of claim 19, further including allowing the scan inputs to overwrite the seed stored by one or more CODECs when receiving multiple instructions.

23. A non-transitory, computer-readable medium storing computer-executable instructions for scan testing a design implemented in an integrated circuit (IC), the design including a plurality of blocks, a plurality of scan chains, and a plurality of compressor and decompressor structures (CODECs), wherein each block includes at least one CODEC, the instructions when executed by a processor cause the processor to execute a process comprising:

receiving scan inputs and determining whether a seed extracted from the scan inputs is broadcast loaded in the plurality of CODECs, multicast loaded in a subset of the plurality of CODECs, or individual loaded in a single CODEC;

individually controlling each of the plurality of CODECs such that all of said CODECs load said seed when broadcast loaded, such that a subset of said CODECs load said seed when multicast loaded, and a single said CODEC loads said seed when individual loaded;

generating patterns for identifying faults of the design using the seed as loaded;

applying the patterns to the plurality of scan chains;

generating X-tolerant (XTOL) control bits to determine a level of observability of the plurality of scan chains; and generating test outputs for analyzing the design using scan outputs from the plurality of scan chains and the XTOL control bits.

24. The non-transitory, computer-readable medium of claim 23, further including receiving a new address instruction including a broadcast bit, the broadcast bit determining whether the seed is multicast loaded in at least a subset of the plurality of CODECs or loaded to a single CODEC.

25. The non-transitory, computer-readable medium of claim 23, further including receiving an increment address instruction, the increment address instruction indicating multicast loading for CODEC addresses higher than a last-used CODEC address.

26. The non-transitory, computer-readable medium of claim 23, further including allowing the scan inputs to overwrite the seed stored by one or more CODECs when receiving multiple instructions.

\* \* \* \* \*